(12) United States Patent
Sakita et al.

(10) Patent No.: US 9,659,836 B2
(45) Date of Patent: May 23, 2017

(54) HEAT DISSIPATION STRUCTURE, FABRICATING METHOD, AND ELECTRONIC APPARATUS

(71) Applicant: FUJITSU LIMITED, Kawasaki-shi, Kanagawa (JP)

(72) Inventors: Yukie Sakita, Atsugi (JP); Yoshitaka Yamaguchi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 49 days.

(21) Appl. No.: 14/956,085

(22) Filed: Dec. 1, 2015

(65) Prior Publication Data

US 2016/0086872 A1   Mar. 24, 2016

Related U.S. Application Data

(63) Continuation of application No. PCT/JP2013/065386, filed on Jun. 3, 2013.

(51) Int. Cl.
*H01L 23/373* (2006.01)
*H05K 7/20* (2006.01)
(Continued)

(52) U.S. Cl.
CPC ............ *H01L 23/373* (2013.01); *B23P 15/26* (2013.01); *B82Y 30/00* (2013.01); *C23C 16/40* (2013.01); *C23C 16/403* (2013.01); *C23C 16/45525* (2013.01); *C23C 16/45555* (2013.01); *F28F 13/185* (2013.01); *F28F 21/02* (2013.01);
(Continued)

(58) Field of Classification Search
CPC .......... H05K 7/20–7/2099; G06F 1/20–1/206; H01L 23/34–23/4735
See application file for complete search history.

(56) References Cited

U.S. PATENT DOCUMENTS 7,291,396 B2 * 11/2007 Huang ................. H01L 23/373
257/E23.11
8,194,407 B2 * 6/2012 Yamaguchi ........... H01L 23/373
165/185

(Continued)

FOREIGN PATENT DOCUMENTS

JP   2006-295120   10/2006
JP   2007-009213   1/2007
(Continued)

OTHER PUBLICATIONS

International Search Report and Written Opinion of the International Searching Authority (Form PCT/ISA/210, Form PCT/ISA/237), mailed in connection with PCT/JP2013/065386 and mailed Aug. 13, 2013 (6 pages).

(Continued)

*Primary Examiner* — Robert J Hoffberg
(74) *Attorney, Agent, or Firm* — Fujitsu Patent Center

(57) ABSTRACT

Disclosed is a heat dissipation structure that includes a plurality of linear structures made of carbon, each of the linear structures having at least one of a first end and a second end being bent, and a coating layer formed on a surface of each of the linear structures, the coating layer having a part covering the other one of the first ends and the second ends of the linear structures, a thickness of the part allowing the corresponding linear structures to be plastically deformable.

12 Claims, 16 Drawing Sheets

(51) Int. Cl.
- *H01L 23/367* (2006.01)
- *H01L 23/42* (2006.01)
- *H01L 23/00* (2006.01)
- *B23P 15/26* (2006.01)
- *C23C 16/40* (2006.01)
- *C23C 16/455* (2006.01)
- *F28F 13/18* (2006.01)
- *F28F 21/02* (2006.01)
- *H01L 23/31* (2006.01)
- *B82Y 30/00* (2011.01)
- *B82Y 10/00* (2011.01)

(52) U.S. Cl.
CPC ........ *H01L 23/3157* (2013.01); *H01L 23/367* (2013.01); *H01L 23/3737* (2013.01); *H01L 23/42* (2013.01); *H01L 24/29* (2013.01); *H01L 24/83* (2013.01); *H05K 7/2039* (2013.01); *B82Y 10/00* (2013.01); *H01L 2224/2929* (2013.01); *H01L 2224/29393* (2013.01); *H01L 2224/29486* (2013.01); *H01L 2224/29499* (2013.01); *H01L 2224/32245* (2013.01); *H01L 2224/8334* (2013.01); *H01L 2924/15788* (2013.01); *Y10S 977/742* (2013.01)

(56) References Cited

U.S. PATENT DOCUMENTS

| | | | |
|---|---|---|---|
| 8,419,885 B2 * | 4/2013 | Fisher | H01L 23/373 156/272.2 |
| 8,749,979 B2 * | 6/2014 | Iwai | H01L 23/373 361/705 |
| 8,837,149 B2 * | 9/2014 | Hirose | H01L 21/4871 156/247 |
| 8,919,428 B2 * | 12/2014 | Cola | B01J 23/745 165/185 |
| 8,958,207 B2 * | 2/2015 | Yamaguchi | H01L 23/373 165/104.33 |
| 9,105,600 B2 * | 8/2015 | Yamaguchi | H01L 23/373 |
| 9,137,926 B2 * | 9/2015 | Yamaguchi | H05K 7/2039 |
| 2006/0231970 A1 | 10/2006 | Huang et al. | |
| 2010/0243227 A1 | 9/2010 | Wu et al. | |
| 2010/0299918 A1 | 12/2010 | Oda | |
| 2012/0236502 A1 | 9/2012 | Yamaguchi et al. | |
| 2012/0325454 A1 * | 12/2012 | Iwai | H01L 23/373 165/185 |
| 2013/0309513 A1 * | 11/2013 | Denkmann | C23C 26/00 428/472.2 |
| 2014/0140008 A1 | 5/2014 | Yamaguchi et al. | |
| 2014/0227477 A1 * | 8/2014 | Cola | H01L 23/373 428/98 |
| 2016/0104655 A1 * | 4/2016 | Kawabata | B82Y 30/00 165/80.2 |
| 2016/0276246 A1 * | 9/2016 | Yamaguchi | H01L 23/3737 |

FOREIGN PATENT DOCUMENTS

| | | |
|---|---|---|
| JP | 2009-164552 | 7/2009 |
| JP | 2010-278281 | 12/2010 |
| JP | 2011-204749 | 10/2011 |
| JP | 2012-199335 | 10/2012 |
| WO | 2013/046291 | 4/2013 |

OTHER PUBLICATIONS

Taiwanese Office Action mailed by Taiwan Patent Office and corresponding to Patent Application No. 103101974, dated Apr. 28, 2015, with partial English translation (11 pages).

Savannah 100 & 200 Atomic Layer Deposition System, User Manual, Cambridge NanoTech Confidential 2007 (42 pages).

Picosun, ALTECH, http://www.ksv.jp/picosun/principle.html. Retrieved from the internet Apr. 30, 2013 (2 pages).

Picosun, ALTECH, http://www.ksv.jp/picosun/principle.html. Retrieved from the internet May 23, 2013 (2 pages).

Japanese Office Action mailed on Jan. 24, 2017 for corresponding Japanese Patent Application No. 2015-521189, with English Translation, 5 pages.

* cited by examiner

HEAT DISSIPATION STRUCTURE, FABRICATING METHOD, AND ELECTRONIC APPARATUS

CROSS-REFERENCE TO RELATED APPLICATIONS

This application is a continuation application of International Application PCT/JP2013/065386 filed on Jun. 3, 2013 and designated the U.S., the entire contents of which are incorporated herein by reference.

FIELD

The embodiments discussed herein relate to a heat dissipation structure, a fabricating method, and an electronic apparatus.

BACKGROUND

Electronic components in central processing units (CPUs) of servers or personal computers may be required to efficiently dissipate heat generated from semiconductor elements. Such electronic components thus have structures provided with heat spreaders made of materials having high thermal conductivity such as copper, which are disposed immediately above the semiconductor elements.

The heat sources and the heat spreaders have microscopic roughness, and hence have insufficient contact areas when brought into direct contact with each other. This may result in high thermal resistance in the contact interface, disabling the electronic components to efficiently dissipate heat. To reduce the contact thermal resistance, the heat sources and the heat spreaders may be connected via thermal interface materials (TIM).

The thermal interface materials may need to have high thermal conductivity and contact properties with respect to wider microscopic roughened surfaces of the heat sources and the heat spreaders.

Examples of the related art thermal interface materials include thermal grease, phase change materials (PCMB), and indium. Major characteristics of the above example thermal interface materials may be capability of securing wider contact areas with respect to the microscopic roughened surfaces because these materials have flowability at temperatures lower than the heat resistant temperatures of the electronic apparatuses.

However, the thermal grease or phase change materials have a relatively low thermal conductivity range of 1 to 5 W/m·K. Indium is a rare metal, and the price of indium has significantly risen owing to a significant increase in the demand of indium-tin oxide related materials, which leads to much expectation of more inexpensive alternative materials.

With this respect, linear structures of carbon represented by carbon nanotubes have attracted much attention. Carbon nanotubes have a significantly high thermal conductivity range (1500 to 3000 W/m·K) as well as having high flexibility and high thermal resistance. Carbon nanotubes may thus serve as prospective heat dissipation materials.

The related art technologies propose heat dissipation structures fabricated by dispersing carbon nanotubes in resin, and heat dissipation structures fabricated by embedding a bundle of carbon nanotubes growing on the substrate with resin.

RELATED ART DOCUMENTS

Patent Document 1: Japanese Laid-open Patent Publication No. 2006-295120

Patent Document 2: Japanese Laid-open Patent Publication No. 2007-9213

Patent Document 3: Japanese Laid-open Patent Publication No. 2012-199335

SUMMARY

According to an aspect of embodiments, there is provided a heat dissipation structure that includes a plurality of linear structures made of carbon, each of the linear structures having at least one of a first end and a second end being bent; and a coating layer formed on a surface of each of the linear structures, the coating layer having a part covering the other one of the first ends and the second ends of the linear structures, a thickness of the part allowing the corresponding linear structures to be plastically deformable.

According to another aspect of embodiments, there is provided a method of fabricating a heat dissipation structure. The method includes forming a plurality of linear structures made of carbon on a substrate, each of the linear structures having a first end and a second end; bending the first ends of the linear structures; and forming a coating layer on a surface of the linear structures by atomic layer deposition, the coating layer having a part covering the second ends of the linear structures, a thickness of the part allowing the corresponding linear structures to be plastically deformable.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

The related art thermal conductive sheet does not allow the carbon nanotubes (CNTs) to fully exhibit the excellent thermal conductivity.

The following embodiments proposes a heat dissipation structure having good thermal conductivity, a method of fabricating the heat dissipation structure, and an electronic apparatus having the heat dissipation structure.

The related art thermal conductive sheets are structured to include carbon nanotubes (CNTs) having end faces to be in contact with a heat generator or a heat dissipater at respective points.

Such a structure may include CNTs having their end faces partially failing to be in contact with the heat generator or the heat dissipater because bringing all the end faces of CNTs securely into contact with the heat generator or the heat dissipater may be technically complicated.

The thermal conductive sheets having the CNTs partially failing to be in contact with the heat generator or the heat dissipater may lead to degradation of thermal conductivity in the thermal conductive sheets and may fail to radiate or dissipate heat generated from the heat generator.

Embodiments

The following describes a heat dissipation structure according to an embodiment, a method of fabricating the heat dissipation structure, an electronic apparatus having the heat dissipation structure, and a method of producing the electronic apparatus.

Heat Dissipation Structure

Figure 1:
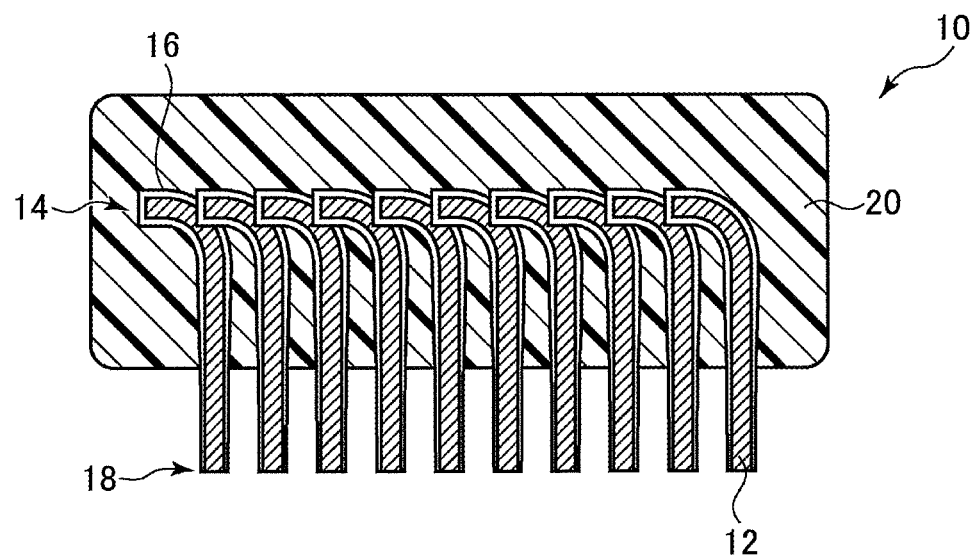
FIG. 1 is a cross-sectional view illustrating an example of a heat dissipation structure according to the embodiment.

First, a heat dissipation structure of the embodiment is described with reference to FIG. 1. FIG. 1 is a cross-sectional view illustrating an example of the heat dissipation structure according to the embodiment.

As illustrated in FIG. 1, a heat dissipation structure 10 (e.g., a heat dissipation member, a heat dissipation material, a heat dissipation sheet, and a thermal conductive sheet) according to the embodiment includes multiple linear structures (carbon nanotubes, CNTs 12) made of carbon. The CNTs 12 are formed at predetermined intervals.

The CNTs 12 may be single layer carbon nanotubes or multilayer carbon nanotubes. This embodiment illustrates an example having multilayer carbon nanotubes.

The number of carbon nanotubes included in each of the multilayer carbon nanotubes is not particularly specified; however, the number of carbon nanotubes included may range from 3 to 6. The number of carbon nanotubes included in each of the multilayer carbon nanotubes is not particularly specified; however, the number of carbon nanotubes included may be in a range of 4 to 6. The diameter of the CNT 12 is not particularly specified; however, the diameter of the CNT 12 may be in a range of 10 to 20 nm. The mean diameter of the CNT 12 may be approximately 15 nm, for example. The length of the CNT 12 is not particularly specified; however, the diameter of the CNT 12 may be in a range of 50 to 200 µm. The surface density of the CNT 12 is not particularly specified; however, the surface density of the CNT 12 may preferably be $1*10^{10}/cm^2$ or more, in view of obtaining sufficient thermal conductivity. The surface density of the CNT 12 in this example may be $1*10^{11}/cm^2$ or more, for example.

Tip parts 14 of the CNTs 12 are bent.

Note that the tip parts 14 of the CNTs 12 indicate opposite parts of the CNTs 12 near a substrate side when the CNTs are grown on the substrate. The parts of the CNTs 12 near the substrate side when the CNTs 12 are grown on the substrate are called base parts of the CNTs 12.

Coating layers (also called a film, or coating) 16 are formed over the surfaces of the CNTs 12. Such coating layers 16 are formed to cover the surfaces of the CNTs 12. Covering the surfaces of the CNTs 12 with the coating layers 16 may improve elasticity (i.e., mechanical strength) of the CNTs 12. The coating layers 16 may be made of, but not specifically limited to, oxides. Examples of the oxides for use in making the coating layers 16 may include, but not specifically limited to, aluminum oxides ($Al_2O_3$), titanium oxides (TiOx), hafnium oxides (HfOx), iron oxides (FeOx), indium oxides (InOx), and lanthanum oxides (LaOx). Examples of the oxides for use in the coating layers 16 further include molybdenum oxides (MoOx), niobium oxides (NbOx), nickel oxides (NiO), ruthenium oxides (RuOx), silicon oxides ($SiO_2$), vanadium oxides (VOx), and tungsten oxides (WOx). Examples of the oxides for use in the coating layers 16 still further include yttrium oxides (YOx) and zirconium oxides (ZrOx). In this example, aluminum oxides (aluminum oxide, or alumina) is used as materials for forming the coating layers 16. The coating layers 16 may be formed by atomic layer deposition (ALD).

The thicknesses of the coating layers 16 gradually decrease from the tip parts 14 of the CNTs 12 toward the base parts 18 of the CNTs 12. That is, the particle diameters of the oxides in the coating layers 16 gradually decrease from the tip parts 14 towards the base parts 18 of the CNTs 12. The CNT 12 that is covered with a thin coating layer 16 deforms plastically; however, the CNT 12 that is covered with a thicker coating layer 16 will deform elastically. The coating layers 16 that cover the base parts 18 of the CNTs 12 are sufficiently thinner to allow the CNTs 12 to deform plastically. The coating layers 16 that cover the remaining parts of the CNTs 12, excluding areas near the base parts 18 are sufficiently thicker to allow the CNTs 12 to secure mechanical strength. The areas of the CNTs 12 excluding the base parts 18 may deform elastically.

The thickness (the particle size) of the coating layer 16 that will not deform the CNT 12 plastically is called a "critical thickness" (a "critical particle size") of the coating layer 16. Such a critical thickness of the coating layer 16 is found by gradually increasing the thickness (the particle size of oxide) of the coating layer 16 to find the thickness (the particle size) of the coating layer 16 that will not deform plastically. A part (first part) of the CNT 12 covered with the coating layer 16 that is thicker than the critical thickness will deform elastically. A part (second part) of the CNT 12 covered with the coating layer 16 that is thinner than the critical thickness will deform plastically. Such a critical thickness may vary with properties of the coating layer 16, and may thus vary; the CNT 12 covered with the coating layer 16 having a thickness (a particle size) of 20 nm or less may frequently deform plastically. Accordingly, the thickness (the particle size) of the coating layer 16 that covers the base part 18 of the CNT 12 may be configured to be 20 nm or less. For example, the thickness (the particle size) of the coating layer 16 that covers the base part 18 of the CNT 12 may be approximately 19.6 nm. On the other hand, the thickness (the particle size) of the coating layer 16 that covers the tip part 14 of the CNT 12 may be approximately 37 nm.

Middle parts of the CNTs 12 between the tip parts 14 and the base parts 18 of the respective CNTs 12 are aligned in parallel with one another. More specifically, the middle parts of the CNTs 12 between the tip parts 14 and the base parts 18 of the respective CNTs 12 are vertically aligned in parallel with one another.

The base parts 18 of the CNTs 12 may deform plastically as already described above. As will be discussed later, the base parts 18 of the CNTs 12 may be bent at assembling.

In the present embodiment, the tip parts 14 of the CNTs 12 are bent (bent), and the based parts 18 of the CNTs 12 are plastically deformable for the following reasons.

The related art configuration has two ends of each of the CNTs to be in contact with the heat generator or the heat dissipater at respective points (hereinafter such contact may also be referred to as "point contact(s)"). However, the surface of the heat generator or the heat dissipater has roughness, which may make it difficult to reliably or securely bring the tip parts and the base parts of the CNTs into contact with the heat generator or the heat dissipater. In addition, the CNTs connected via the point contacts frequently fail to follow the deformation of the heat generator or the heat dissipater.

To allow the heat dissipation structure to follow the rough surface of the heat generator or the heat dissipater, the related art technology may sandwich a heat dissipation structure between the heat generator and the heat dissipater, and subsequently apply pressure to the structure while applying heat. In this case, the heat dissipation structure may deform, which may cause the heights of the end parts of the CNTs to vary. This may allow only part of the CNTs to be in contact with the heat generator or the heat dissipater. Heat may be scarcely transferred to the parts of the CNTs that are not in contact with the heat generator or the heat dissipater.

The related art heat dissipation structure may, as described above, be less likely to have good thermal conductivity.

To improve thermal conductivity compared to the related art heat dissipation structure, the embodiment proposes bending the tip parts 14 or the base parts 18 of the CNTs 12 to allow lateral faces of the tip parts 14 or the base parts 18 of the CNTs 12 to be in linear contact with the heat generator or the heat dissipater. In addition, the bent tip parts 14 or the bent base parts 18 of the CNTs 12 may easily follow the deformation of the heat generator or the heat dissipater. This may prevent formation of the CNTs 12 that are not in contact with the heat generator or the heat dissipater. Hence, the present embodiment may provide a heat dissipation structure having good thermal conductivity.

The heat dissipation structure of the present embodiment allows the tip parts 14 of the CNTs 12 and the base parts 18 of the CNTs 12 to be bent because of the above-described reasons.

The heat dissipation structure of the present embodiment further includes a filler layer (a resin layer) 20 that fills intervals (spaces) between the CNTs 12. The tip parts 14 of the CNTs 12 are embedded in the filler layer 20. By contrast, the base parts 18 of the CNTs 12 are exposed from the filler layer 20. The filler layer 20 may be made of thermoplastic resin, for example. The filler layer 20 has properties capable of reversibly varying its state between solid and liquid with temperature; the filler layer 20 is solid at room temperature, becomes liquid by heating, and is returning to solid while exhibiting adhesiveness by cooling. The filler layer 20 may be made of hot melt resin such as those noted below. An example of polyamide-based hot melt resin may include "Micromelt 6239" (the softening point temperature: 140° C.) produced by Henkel Japan Ltd. An example of polyester-based hot melt resin may include "DH 598B" (the softening point temperature: 133° C.) produced by Nogawa Chemical Co. Ltd. An example of polyurethane-based hot melt resin may include "DH 722B" produced by Nogawa Chemical Co. Ltd. An example of polyamide-based resin may include "EP-90" (the softening point temperature: 148° C.) produced by Matsumura-oil Co. Ltd. An example of ethylene copolymer hot melt resin may include "DA 574B" (the softening point temperature: 105° C.) produced by Nogawa Chemical Co. Ltd. An example of SBR-based resin may include "M-6250" (the softening point temperature: 125° C.) produced by Yokohama Rubber Co. Ltd. An example of EVA-based resin may include "3747" (the softening point temperature: 104° C.) produced by Sumitomo 3M Limited Ltd. An example of butyl rubber-based resin may include "M-6158" (the softening point temperature: 125° C.) produced by Yokohama Rubber Co. Ltd. In this example, "Micromelt 6239" produced by Henkel Japan Ltd. is employed as a material for the filler layer 20.

The melting temperature of the filler layer 20 may preferably be higher than the upper limit temperature generated by the heat generator 24 to which the heat dissipation structure 10 is attached (see FIG. 3) during operation. In addition, the melting temperature of the filler layer 20 may preferably be higher than the temperature at which the heat treatment is applied after assembling; that is, after the heat dissipation structure 10, the heat generator 24, and the heat dissipater (heat spreader) 28 (see FIG. 3) are attached to a circuit board 22 (see FIG. 3). This is because melting the filler layer 20 after assembling may make the heat dissipation structure 10 deform to damage the orientation of the CNTs 12, leading to a decrease in the thermal conductivity.

The heat dissipation structure 10 according to the embodiment is thus formed as described above.

The heat dissipation structure 10 according to the embodiment may thus allow the tip parts 14 of the CNTs 12 to be bent. The coating layer 16 formed on the surface of each CNT includes a part covering the base parts 18 of the CNTs 12, and the thickness of the part covering the base parts 18 may allow the CNT 12 to be plastically deformable. This structure may allow the base parts 18 of the CNTs 12 to be bent. Thus, the lateral faces of the tip parts 14 or the base parts 18 of the CNTs may be in linear contact with the heat generator or the heat dissipater. In addition, the bent tip parts 14 or the bent base parts 18 of the CNTs 12 may easily follow the deformation of the heat generator or the heat dissipater. The embodiment may thus prevent formation of the CNTs 12 that are not in contact with the heat generator or the heat dissipater. The embodiment may thus provide a heat dissipation structure implementing good thermal conductivity. Note that the above-described example has illustrated the heat dissipation structure 10 including the CNTs 12 having the base parts 18 being exposed from the filler layer 20; however, the embodiment is not limited to this example.

Figure 2:
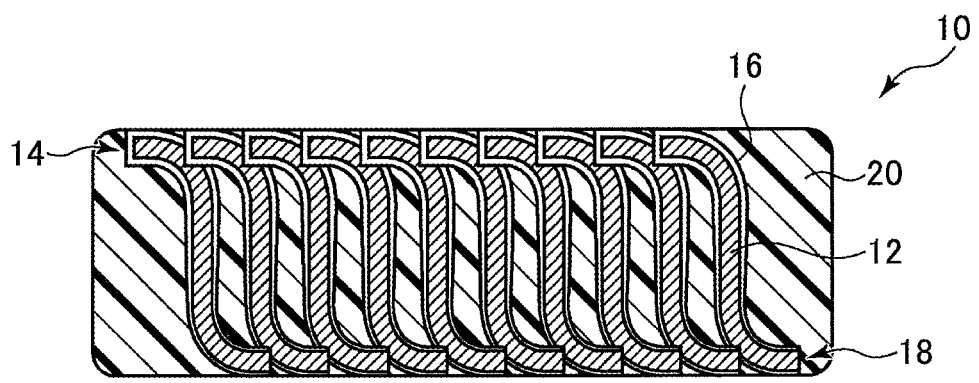
FIG. 2 is a cross-sectional view illustrating another example of a heat dissipation structure according to an embodiment.

For example, the heat dissipation structure 10 may include the CNTs 12 having the bent base parts 18 embedded in the filler layer 20, as illustrated in FIG. 2.

FIG. 2 is a cross-sectional view illustrating another example of a heat dissipation structure according to an embodiment.

As illustrated in FIG. 2, the base parts 18 of the CNTs 12 are bent, and the bent base parts 18 are embedded in the filler layer 20. Note that the base parts 18 of the CNTs 12 are bent after the coating layers 16 are formed on the respective surfaces of the CNTs 12.

The heat dissipation structure 10 may have both the tip parts 14 and the base parts 18 of the CNTs 12 being bent, and the CNTs 12 having the bent tip parts 14 and the bent base parts 18 are embedded in the filler layer 20.

Electronic Apparatus

Figure 3:
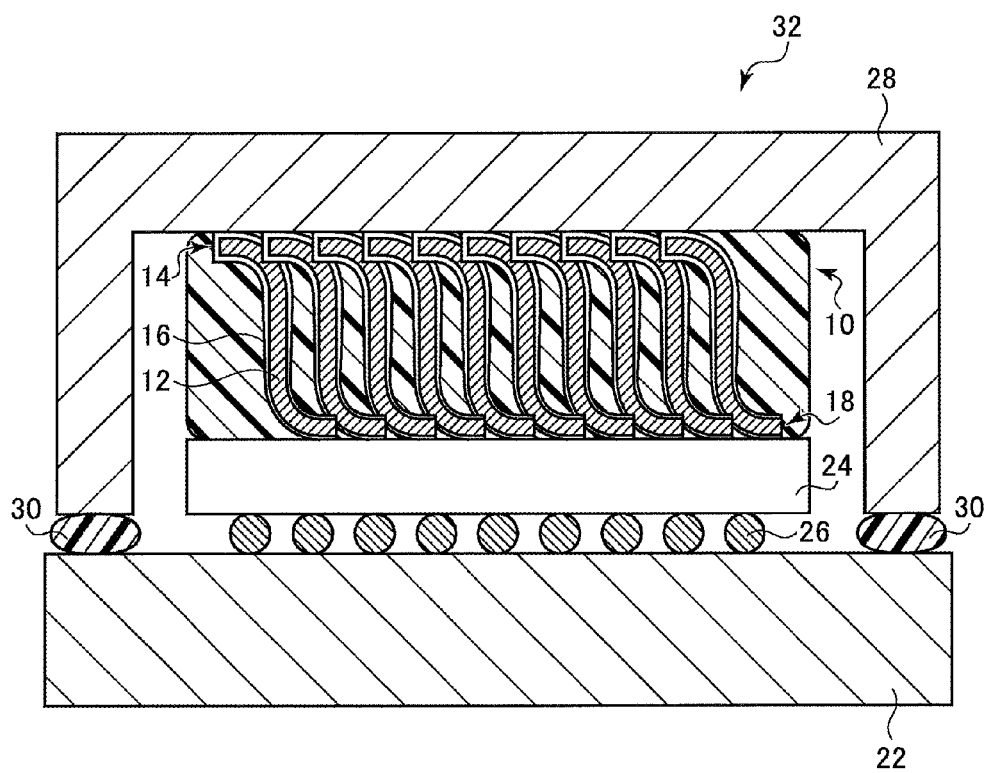
FIG. 3 is a cross-sectional view illustrating an example of an electronic apparatus according to an embodiment.

The following describes an electronic apparatus having the heat dissipation structure according to an embodiment with reference to FIG. 3. FIG. 3 is a cross-sectional view illustrating an example of an electronic apparatus according to the embodiment.

As illustrated in FIG. 3, a semiconductor element (semiconductor chip) 24 such as a central processing unit (CPU) is mounted on a circuit board 22 such as a multi-layer wiring substrate. The semiconductor element 24 is electrically coupled to the circuit board 22 via solder bumps 26 and the like.

A heat spreader 28 is configured to diffuse heat generated by the semiconductor element 24, and the heat spreader 28 is formed to cover the semiconductor element 24. The above-described heat dissipation structure 10 according to the embodiment is disposed between the semiconductor element 24 and the heat spreader 28. The heat spreader 28 may be adhered to the circuit board 22 with such as organic sealant 30.

The electronic apparatus according to the embodiment includes the heat dissipation structure of the embodiment between the semiconductor element 24 and the heat spreader 28. More specifically, the electronic apparatus according to the embodiment includes the heat dissipation structure 10 between the heat generator 124 and the heat dissipater 28.

The lateral faces of the bent tip parts 14 of the CNTs 12 may be partially in contact with the heat dissipater 28.

The lateral faces of the bent base parts 18 of the CNTs 12 may be partially in contact with the heat generator 24.

Note that the lateral faces of the bent tip parts 14 of the CNTs 12 may be partially in contact with the heat generator 24. Further, the lateral faces of the bent base parts 18 of the CNTs 12 may be partially in contact with the heat dissipater 28.

The electronic apparatus 32 according to the embodiment is thus formed as described above.

Method of Fabricating Heat Dissipation Structure

Next, a description is given, with reference to FIGS. 4A to 7B, of a method of fabricating the heat dissipation structure according to the embodiment. FIGS. 4A to 7B are cross-sectional process views illustrating a method of fabricating the heat dissipation structure according to the embodiment.

Figure 4A:
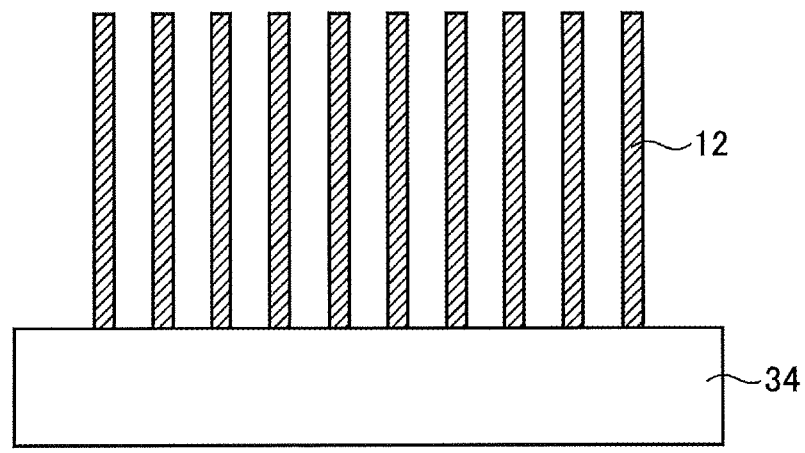
FIGS. 4A and 4B are cross-sectional process views (1) illustrating an example of a fabrication method of the heat dissipation structure according to the embodiment.

Initially, a substrate (a base material or a base) 34 serving a base board for use in growing the carbon nanotubes (CNTs) 12 is prepared as illustrated in FIG. 4A. The substrate 34 prepared may be a silicon substrate, for example.

However, the substrate 34 is not limited to the silicon substrate. For example, an alumina substrate, a sapphire substrate, a Mg substrate, a glass substrate, and the like may be prepared as the substrate 34.

Subsequently, a not-illustrated a silicon oxide film having a thickness of 300 nm may be formed on a surface of the substrate 24 by chemical vapor deposition (CVD) or thermal oxidation.

Next, a not-illustrated base film is formed on the silicon oxide film. The base film serves as a primary coat of a later described catalytic metal film (not illustrated). The base film may be made of molybdenum (Mo), titanium (Ti), hafnium (Hf), zirconium (Zr), niobium (Nb), vanadium (V), tantalum nitride (TaN), titanium silicide (TiSix), and aluminum (Al). In addition, the base film may also be made of aluminum oxide ($Al_2O_3$), titanium oxide (TiOx), tantalum (Ta), tungsten (W), copper (Cu), gold (Au), platinum (Pt), palladium (Pd), and titanium nitride (TiN), and the like. The base film may also be made of an alloy including any of the above-described materials. In this example, the base film may be made of aluminum.

Subsequently, a not-illustrated catalytic metal film is formed by sputtering. The catalytic metal film serves as a catalyst for growing the CNTs 12 on the substrate 34. The catalytic metal film may be made of iron (Fe), cobalt (Co), nickel (Ni), gold (Au), silver (Ag), and platinum (Pt), and an alloy including any of these materials. In this example, the catalytic metal film may be made of iron.

When the base film (not illustrated) is made of aluminum, and the catalytic metal film is made of iron, a layered structure of the aluminum film and the iron film is formed on the substrate 34. In such a case, the thickness of the aluminum base film may be approximately 10 nm, and the thickness of the iron catalytic film may be approximately 2.5 nm.

When the base film is made of titanium nitride, and the catalytic metal film is made of cobalt, a layered structure of the titanium nitride film and the cobalt catalytic film is formed on the substrate 34. In such a case, the thickness of the titanium nitride base film may be approximately 5 nm, and the thickness of the cobalt catalytic film may be approximately 2.5 nm.

Further, a catalyst for use in growing the CNTs is not limited to a metal film, but may be metallic microparticles. The size of the metallic microparticles serving as the catalyst may preferably be controlled by a differential mobility analyzer (DMA), for example. The metallic microparticles may be made of the same materials as those of the above-described catalytic metal films.

When the base film is made of titanium nitride and the metal microparticles are made of cobalt, a structure having cobalt microparticles disposed on the titanium nitride base film is formed on the substrate 34. In such a case, the thickness of the titanium nitride base film may be approximately 5 nm, and the thickness of the cobalt microparticles may be approximately 3.8 nm.

Subsequently, the CNTs 12 are grown on the catalyst-formed substrate 34 by hot filament chemical vapor deposition (hot filament CVD). The growth condition of the CNTs 12 may be as follows. A mixed gas composed of acetylene gas and argon gas may be used as a raw material gas. The partial pressure ratio of the acetylene gas to the argon gas may be approximately 1:9. The total gas pressure within a growth chamber may be 1 kPa. The temperature of the hot filament may be approximately 1000° C. The growth rate of the CNTs 12 under such a growth condition may be 4 μm/min. The lengths of the CNTs may be approximately 80 μm. The length of the CNTs may be controlled by appropriately adjusting a growing time. The number of carbon nanotube layers included in each of the multilayer carbon nanotubes may range from 3 to 6. The mean number of carbon nanotube layers included in each of the multilayer carbon nanotubes may be 4. The diameter of the CNT 12 may range from 4 to 8 nm. The mean diameter of the CNT 12 may be approximately 6 nm, for example. The surface density of the CNT 12 is not particularly specified; however, the surface density of the CNT 12 may preferably be $1*10^{10}/cm^2$ or more, in view of obtaining sufficient heat dissipation. The surface density of the CNT 12 that is grown under the above-described growth condition may be approximately $1*10^{11}/cm^2$.

Note that the method of growing the CNTs 12 is not limited to the hot filament CVD process. The CNTs 12 may be grown by thermal CVD or remote plasma CVD.

Further, the CNTs 12 grown may be single layer carbon nanotubes.

The raw material for use in growing the CNTs 12 is not limited to acetylene. Hydrocarbons such as methane gas or ethylene gas may be used as raw materials to grow the CNTs 12. Alcohols such as ethanol, methanol, and the like may be used as raw materials to grow the CNTs 12.

Figure 4B:
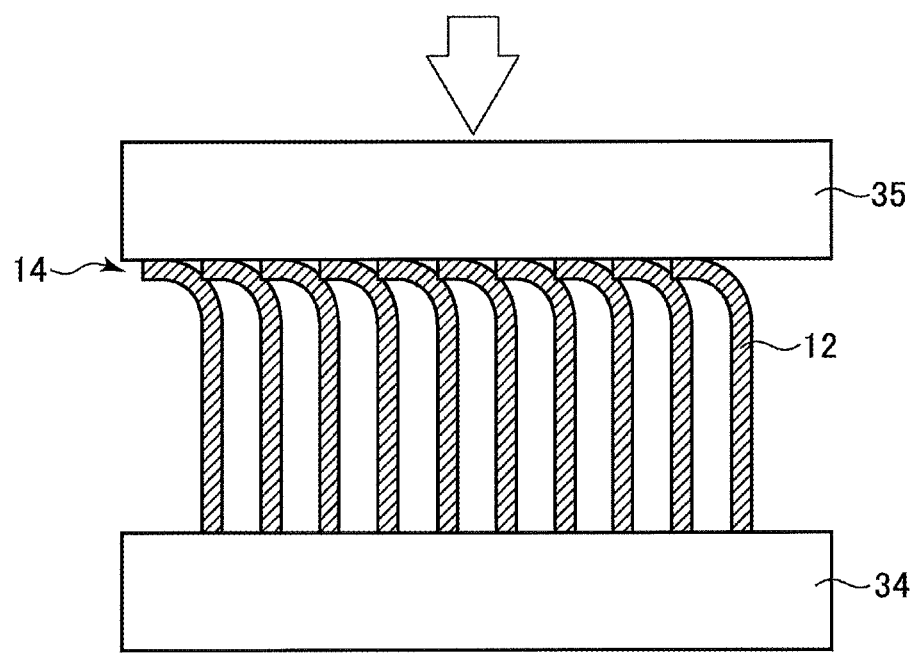

Subsequently, pressure is applied to the CNTs 12; that is, a load is applied to the CNTs 12 to bend the tip parts 14 of the CNTs 12 as illustrated in FIG. 4B. Specifically, a flat structure 35 is brought into contact with the tip parts 14 of the CNTs 12, and a load is applied to the CNTs 12 by the structure 35. The structure 35 may be a silicon substrate, for example. The load applied may preferably be in a range of 0.125 to 0.25 MPa. The tip parts 14 of the CNTs 12 may thus deform plastically, thereby producing the CNTs 12 having the bent tip parts 14.

Figure 5A:
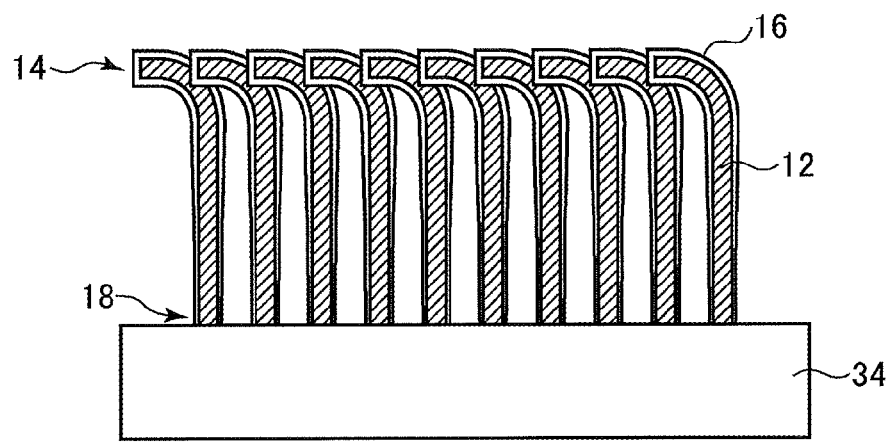
FIGS. 5A and 5B are cross-sectional process views (2) illustrating the example of the fabrication method of the heat dissipation structure according to the embodiment.

Next, the coating layers 16 may be formed by ALD as illustrated in FIG. 5A. The ALD includes alternately supplying on the substrate different reaction gases, which are used as raw materials to deposit layers, allowing the substrate to adsorb the different reaction gases in one atomic layer unit or one molecular layer unit, and chemically reacting the different reaction gases to deposit the coating layers 16 on the surface of the substrate. An atomic layer deposition (ALD) apparatus may be employed for forming the coating layers 16 by ALD. Savannah 100 or Savannah 200 produced by Cambridge Nanotech may be used as the atomic layer deposition (ALD) apparatus.

The coating layers 16 are formed to cover the surfaces of the CNTs 12. The coating layers 16 may be made of, but not specifically limited to, oxides. Examples of the oxides for use in the coating layers 16 may include, but not specifically limited to, aluminum oxides ($Al_2O_3$), titanium oxides (TiOx), hafnium oxides (HfOx), iron oxides (FeOx), indium oxides (InOx), and lanthanum oxides (LaOx). Examples of the oxides for use in the coating layers 16 further include molybdenum oxides (MoOx), niobium oxides (NbOx), nickel oxides (NiO), ruthenium oxides (RuOx), silicon oxides ($SiO_2$), vanadium oxides (VOx), and tungsten oxides (WOx). Examples of the oxides for use in the coating layers 16 still further include yttrium oxides (YOx) and zirconium oxides (ZrOx). The aluminum oxide coating layers 16 may be formed in this example.

Figure 5B:
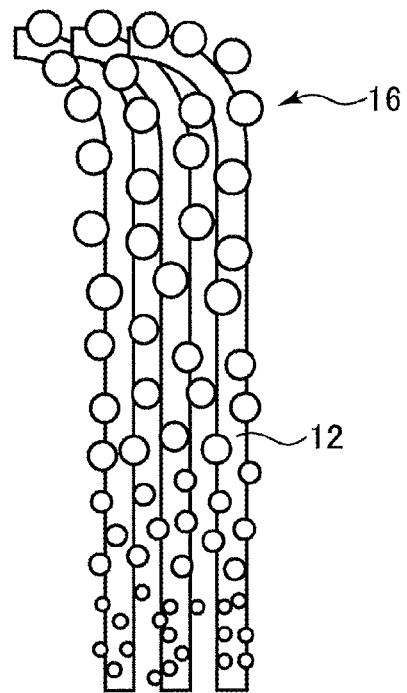

The method of the embodiment forms the coating layers 16 to have their thicknesses gradually decrease from the tip parts 14 toward the base parts 18 of the CNTs 12. That is, the coating layers 16 are formed to have the particle diameters of the oxides gradually decrease from the tip parts 14 towards the base parts 18 of the CNTs 12. FIG. 5B is a schematic view illustrating a gradual decrease in the diameters of the microparticles of the coating layers 16.

As described above, the CNT 12 that is covered with a coating layer 16 thinner than the critical thickness will deform plastically; however, the CNT 12 that is covered with a coating layer 16 thicker than the critical thickness will deform elastically. The thickness of the coating layer 16 that covers the base part 18 of the CNT 12 may be thinner than the critical thickness so as to bend the base part 18 of the CNT 12 after the coating layer 16 has been formed on the surface of the CNT 12. As described above, the critical thickness may be affected by the properties of the coating layer 16 and may thus vary; the CNT 12 covered with the coating layer 16 having a thickness (a particle size) of 20 nm or less may frequently deform plastically. In this example, the thickness (the particle size) of the coating layer 16 that covers the base part 18 of the CNT 12 may be approximately 19.6 nm. On the other hand, the thickness (the particle size) of the coating layer 16 that covers the tip part 14 of the CNT 12 may be approximately 37 nm.

The deposition condition for forming the coating layer 16 by ALD may be as follows. The temperature inside the reaction chamber may be 200° C. Trimethylaluminium (TMA) gas and $H_2O$ gas may be used as a raw material gas (precursor). An inert gas may be used as a purge gas. A $N_2$ gas may be used as the inert gas. The flow rate of the $N_2$ gas may be set approximately to 20 sccm. The purge gas may be kept flowing from the time of starting to deposit the coating layers 16 to the time of completing the deposition of the coating layers 16. The TMA gas and the $H_2O$ gas are alternately supplied to the reaction chamber for depositing the coating layers 16. More specifically, one cycle is determined to include time t1 for supplying the TMA gas in the reaction chamber, time t2 for allowing the state inside the reaction chamber to be in a standby mode, time t3 for supplying the $H_2O$ gas in the reaction chamber, and time t4 for allowing the state inside the reaction chamber to be in a standby mode. The amount of TMA gas supplied per second may be 20 sccm, and the supply time t1 may range from 0.01 to 1 s. The standby time t2 may range from 1 to 30 s. In this example, the standby time t2 may be approximately 8 s. The amount of $H_2O$ gas supplied per second may be 20 sccm, and the supply time t3 may range from 0.01 to 1 s. The standby time t4 may range from 1 to 30 s. In this example, the standby time t4 may be approximately 8 s. The above-described cycle may be repeated 200 cycles (times) to form the coating layers 16.

The method of this embodiment, will not open or close a not-illustrated stop valve when depositing the coating layers 16. The stop valve is configured to stop the gases being discharged from the reaction chamber to the outside.

The method of the embodiment will not open or close the stop valve when depositing the coating layers 16 for the following reasons.

For example, the method of opening or closing the stop valve when depositing the coating layers 16 having the following steps may be proposed. That is, the method includes closing the stop valve before supplying the TMA gas, subsequently supplying the TMA gas into the reaction chamber, and then allowing the state inside the reaction chamber to stand still in a standby state for a predetermined time. The method further includes subsequently opening the stop valve to purge the TMA gas by allowing the state inside the reaction chamber to stand still in a standby state for a predetermined time. The method further includes subsequently closing the stop valve before supplying the $H_2O$ gas, then supplying the $H_2O$ gas into the reaction chamber, and allowing the state inside the reaction chamber to stand still in a standby state for a predetermined time thereafter. The method includes subsequently opening the stop valve to purge the $H_2O$ gas by allowing the state inside the reaction chamber to stand still in a standby state for a predetermined time. The above-described cycle may be repeatedly performed to deposit the coating layers 16.

As described above, the raw material gas may not only sufficiently reach the tip parts 14 but also reach the base parts 18 of the CNTs 12 by closing the stop valve before supplying the raw material gas into the reaction chamber, and allowing the state of the reaction chamber to stand still in a standby state for a predetermined time after supplying the raw material gas into the reaction chamber. In this case, the thicknesses (the particle sizes) of the coating layers 16 become sufficiently greater (larger) both in the tip parts 14 and the base parts 18 of the CNTs 12. When the thickness of the coating layer 16 that covers the base part 18 of the CNT 12 is greater than the critical thickness, the base part 18 of the CNT 12 will not deform plastically, making it difficult to bend the base part 18 of the CNT 12.

By contrast, the method according to the present embodiment will not open or close the stop valve when depositing the coating layers 16, which will not easily allow the raw material gas to reach the base parts 18 of the CNTs 12. Accordingly, the method according to the present embodiment may be capable of forming the coating layers 16 to gradually increase their thicknesses (the particle sizes) from the tip parts 14 toward the base parts 18 of the CNTs 12.

Thus, the method according to the embodiment will not open or close the stop valve when depositing the coating layers 16.

The thickness distribution of the coating layers may be controlled by appropriately adjusting the standby times t2 and t4.

That is, when the standby time t2 is reduced, the $H_2O$ gas will be supplied at the time where the TMA gas has progressed less toward the base parts 18 of the CNTs 12. On the other hand, when the standby time t4 is reduced, the TMA gas will be supplied at the time where the $H_2O$ gas has progressed less toward the base parts 18 of the CNTs 12. In this case, the coating layers 16 may be deposited less on the base parts 18 of the CNTs, resulting in the thinner coating layers 16 formed on the base parts 18 of the CNTs 12.

On the other hand, when the standby time t2 is increased, the $H_2O$ gas will be supplied at the time where the TMA gas has progressed to a certain extent toward the base parts 18 of the CNTs 12. Further, when the standby time t4 is increased, the TMA gas will be supplied at the time where the $H_2O$ gas has progressed to a certain extent toward the base parts 18 of the CNTs 12. In this case, the coating layers 16 may be deposited easily on the base parts 18 of the CNTs, resulting in the thicker coating layers 16 formed on the base parts 18 of the CNTs 12.

Thus, the thickness distribution of the coating layers 16 may be controlled by appropriately adjusting the standby times t2 and t4. That is, the positions at which the thicknesses of the coating layers 16 reaching the critical thickness may be controlled by appropriately adjusting the standby times t2 and t4.

Figure 6A:
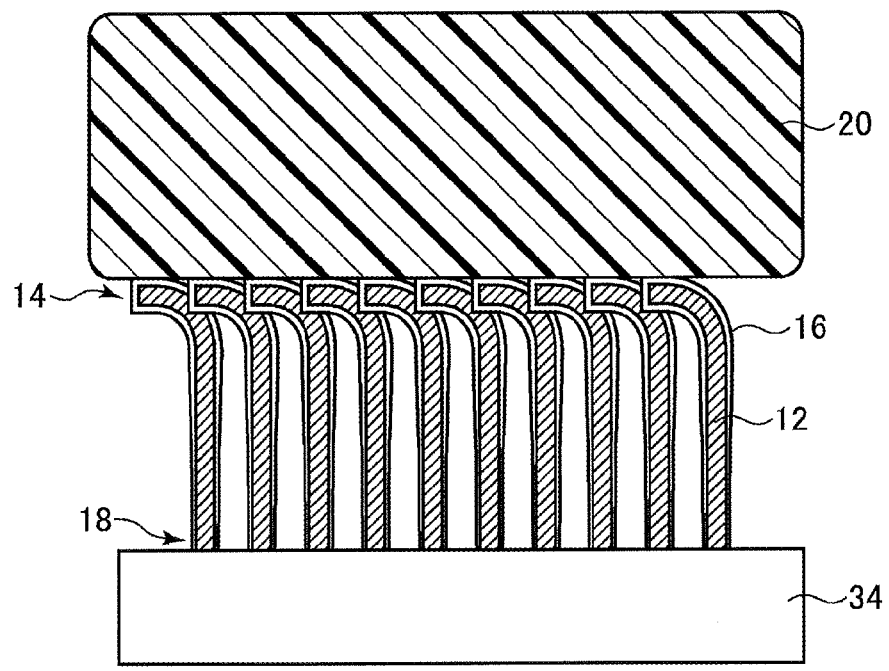
FIGS. 6A and 6B are cross-sectional process views (3) illustrating the example of the fabrication method of the heat dissipation structure according to the embodiment.
Figure 6B:
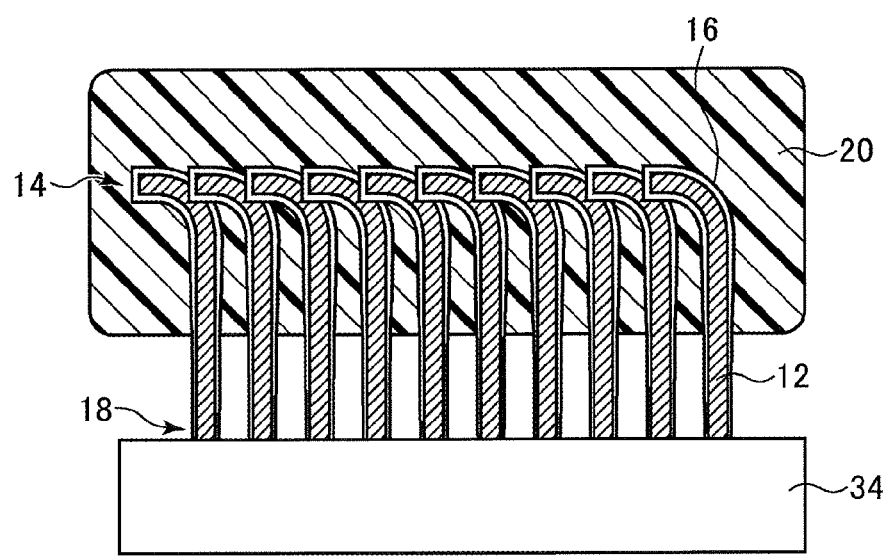

Next, a film of thermoplastic resin (a thermoplastic resin film) 20 is placed on an upper surface of the substrate 34 on which the CNTs 12 having the tip parts 14 being bent and covered with the coating layers 16 are formed, as illustrated in FIG. 6A. The thermoplastic resin film 20 serves as a filler layer. The thickness of the thermoplastic resin film 20 may be approximately 100 μm.

The thermoplastic resin film 20 may be made of hot melt resin. In this example, "Micromelt 6239" produced by Henkel Japan Ltd. is employed as a material for the thermoplastic resin film 20. The melting temperature of the "Micromelt 6239" may range from 135 to 145° C. Further, the viscosity of the "Micromelt 6239" at melting may range from 5.5 to 8.5 Pa·s at 225° C.

Subsequently, the substrate 34 on which the thermoplastic resin film 20 is placed is heated at a melting temperature of the thermoplastic resin film 20 or above. In this step, pressure may be applied on the thermoplastic resin film 20. The thermoplastic resin film 20 may melt as a result to gradually penetrate a bundle of the CNTs 12 (see FIG. 6B). The penetration of the melted thermoplastic resin film 20 may stop before the melted thermoplastic resin film 20 reaches the base parts 18 of the CNTs 12. The distance between a lower face of the thermoplastic resin film 20 and a lower face of the base part 18 of the CNT may be approximately 50 μm. The depth of the thermoplastic resin film 20 penetrating the bundle of the CNTs 12 may be controlled by a heating temperature (i.e., a heat treatment temperature) or heating time (heat treatment time). In this example, the heating temperature may be approximately 195° C., and the heating time may be approximately 5 min. Consequently, the filler layer (resin layer) 20 made of the thermoplastic resin embeds the bundle of the CNTs 12 excluding the base parts 18 of the CNTs 12. Note that the CNTs 12 that are partially embedded in the filler layer 20 will facilitate removal of the CNTs 12 from the substrate 34.

Next, the thermoplastic resin film 20 may be solidified by cooling to room temperature, for example.

Figure 7A:
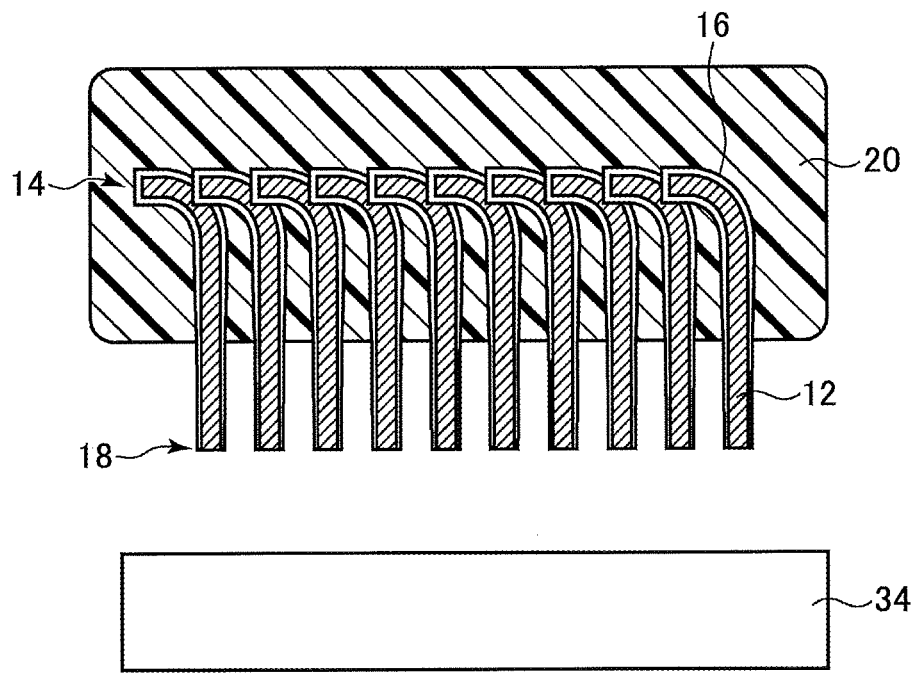
FIGS. 7A and 7B are cross-sectional process views (4) illustrating the example of the fabrication method of the heat dissipation structure according to the embodiment.

Next, the CNTs 12 are removed from the substrate 34 together with the filler layer 20, as illustrated in FIG. 7A.

Figure 7B:
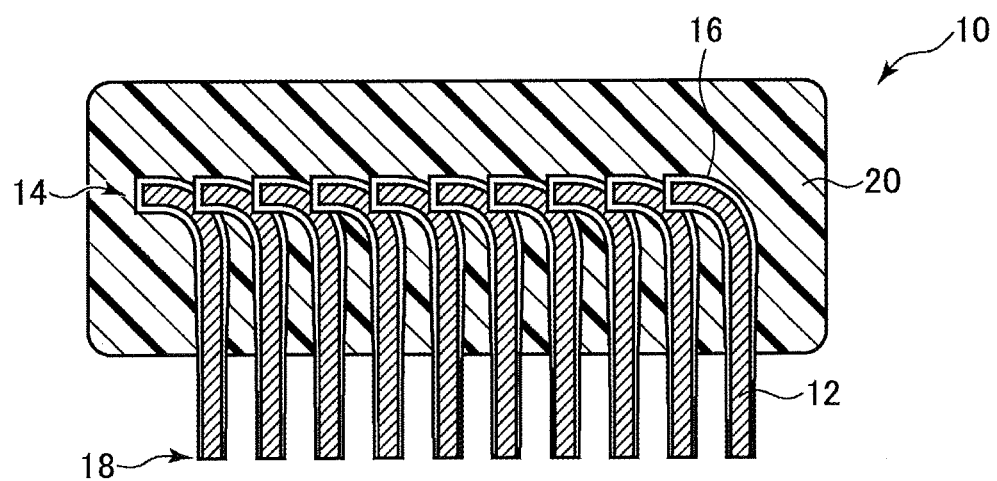

As a result, the heat dissipation structure 10 including the CNTs 12 having the bent tip parts 14 embedded in the filler layer 20 and the plastically deformable base parts 18 exposed from the filler layer 20 is obtained (see FIG. 7B).

The heat dissipation structure 10 according to the embodiment is thus fabricated by the above-described method.

Note that the above-described example has illustrated the heat dissipation structure 10 including the CNTs 12 having the base parts 18 exposed from the filler layer 20; however, the heat dissipation structure 10 is not limited to this example.

For example, the heat dissipation structure 10 may have the CNTs 12 embedded in the filler layer 20 with the base parts 18 being bent as illustrated above with reference to FIG. 2.

FIGS. 8A to 9B are a cross-sectional views illustrating another example of a heat dissipation structure according to an embodiment.

Initially, the heat dissipation structure 10 having the base parts 18 the CNTs 12 being exposed from the filler layer 20 may be obtained by the method of fabricating the heat dissipation structure described with reference to FIGS. 4 to 7B (see FIG. 7B).

Figure 8A:
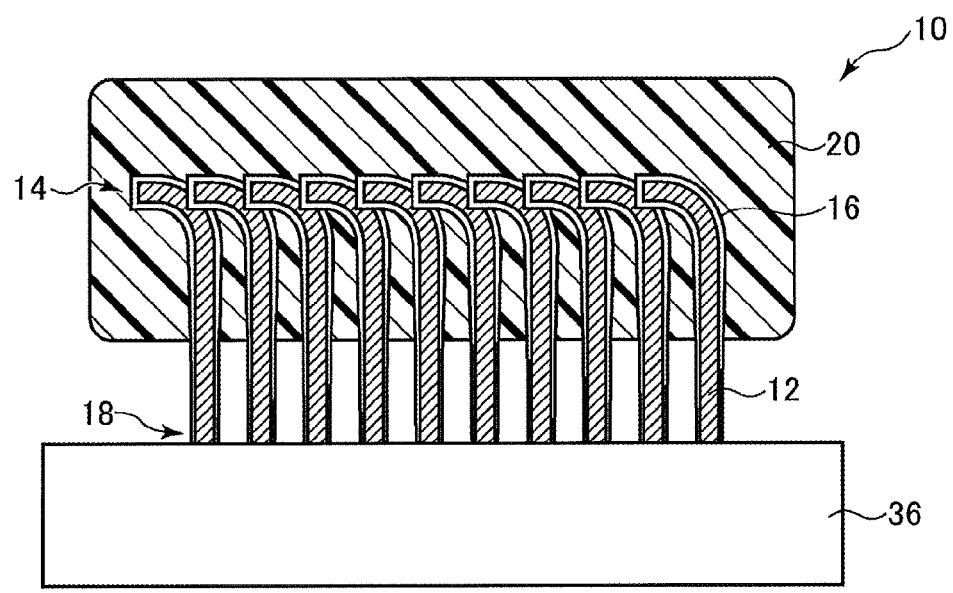
FIGS. 8A and 8B are cross-sectional process views (1) illustrating another example of a fabrication method of the heat dissipation structure according to the embodiment.

Subsequently, the heat dissipation structure 10 is placed on a stand (a base, or a supporting substrate) 36 as illustrated in FIG. 8A. In this step, the heat dissipation structure 10 is placed on the stand 36 to bring the base parts 18 of the CNTs 12 exposed from the filler layer 20 into contact with the stand 36. The stand 36 may be made of Teflon (registered trademark), for example.

Figure 8B:
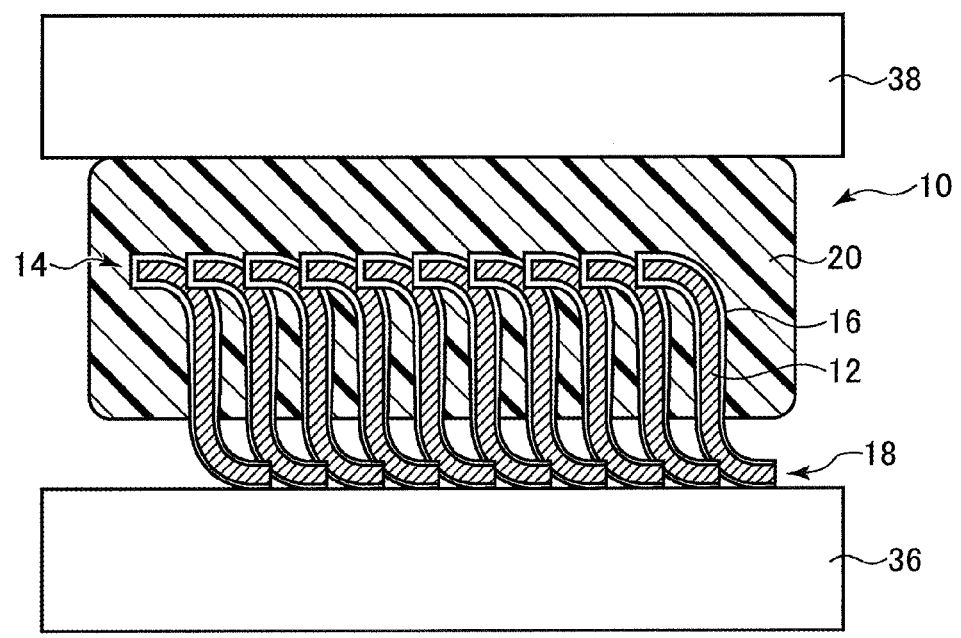

Subsequently, a load is applied to the heat dissipation structure 10 to bend the base parts 18 of the CNTs 12 as illustrated in FIG. 8B. Specifically, a flat structure 38 is brought into contact with the surface of the heat dissipation structure 10, and a load is applied to the CNTs 12 by the structure 38. The structure 38 may be made of Teflon (registered trademark), for example. The load applied may preferably be in a range of 0.5 to 1.5 MPa. As a result, the base parts 18 of the CNTs 12 deform plastically to have the base parts 18 of the CNTs 12 bent.

Subsequently, the heat dissipation structure 10 on the stand 36 is heated to the melting point temperature of the filler layer 20 or above. In this step, a load may optionally be applied to the filler layer 20 by the structure 38. The filler layer 20 may melt as a result to gradually penetrate a bundle of the CNTs 12 (see FIG. 9A). The heating is terminated at the time where the melted filler layer 20 reaches the bottom face of the base parts 18 of the CNTs 12. The heating temperature (heat treatment temperature) may be approximately 225° C. The heating time (i.e., the heat treatment duration) may be approximately 30 min. The tip parts 14 as well as base parts 18 of the CNTs 12 are thus embedded in the filler layer 20.

Next, the filler 20 may be solidified by cooling to room temperature, for example.

Subsequently, the structure 38 is removed from the heat dissipation structure 10, and the heat dissipation structure 10 is removed from the stand 36.

Figure 9A:
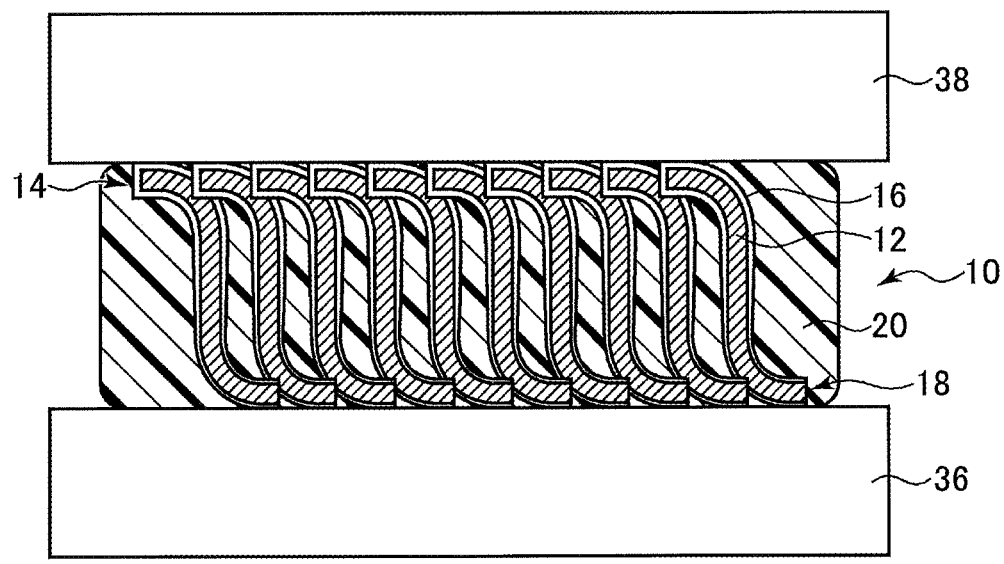
FIGS. 9A and 9B are cross-sectional process views (2) illustrating another example of the fabrication method of the heat dissipation structure according to the embodiment.
Figure 9B:
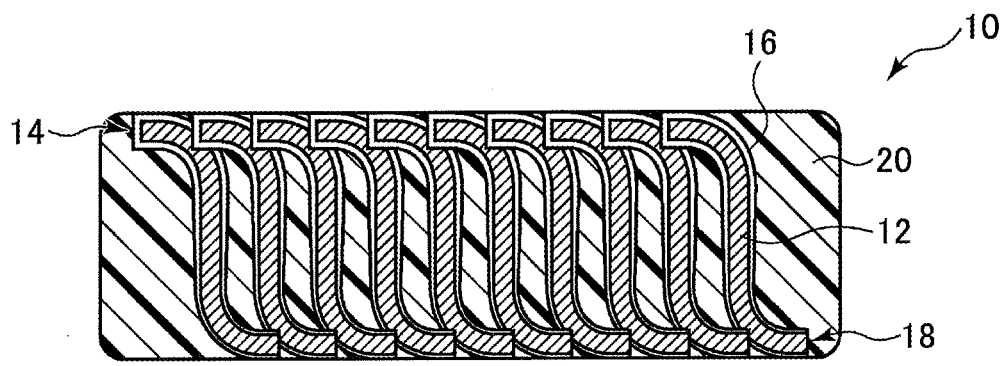

The heat dissipation structure 10 that includes the CNTs 12 having not only the bent tip parts 14 but also the bent base parts 18 embedded in the filler layer 20 may thus be obtained (see FIG. 9B).

As described above, the CNTs 12 having not only the tip parts 14 but also the base parts 18 being bent may be embedded in the filler layer 20.

Evaluation Result

Evaluation results of the heat dissipation structure according to the embodiment are described below.

Figure 10:
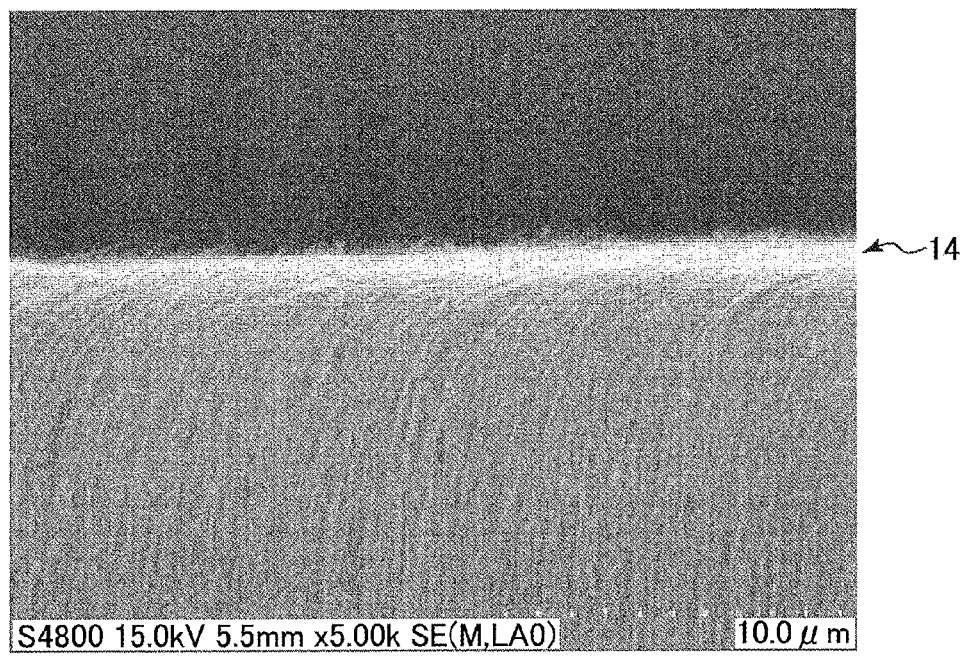
FIG. 10 is a scanning electron microscopic (SEM) photographic image depicting the bent tip parts of carbon nanotubes (CNTs)

FIG. 10 is a scanning electron microscopic (SEM) photographic image depicting the bent tip parts 14 of the CNTs 12. FIG. 10 illustrates the CNTs 12 obtained after a bending process of the tip parts 14 of the CNTs 12 has been completed, and the structure 35 has then been removed from the heat dissipation structure 10 illustrated in FIG. 4B.

As is clear from FIG. 10, the tip parts 14 of the CNTs 12 are sufficiently bent.

Figure 11:
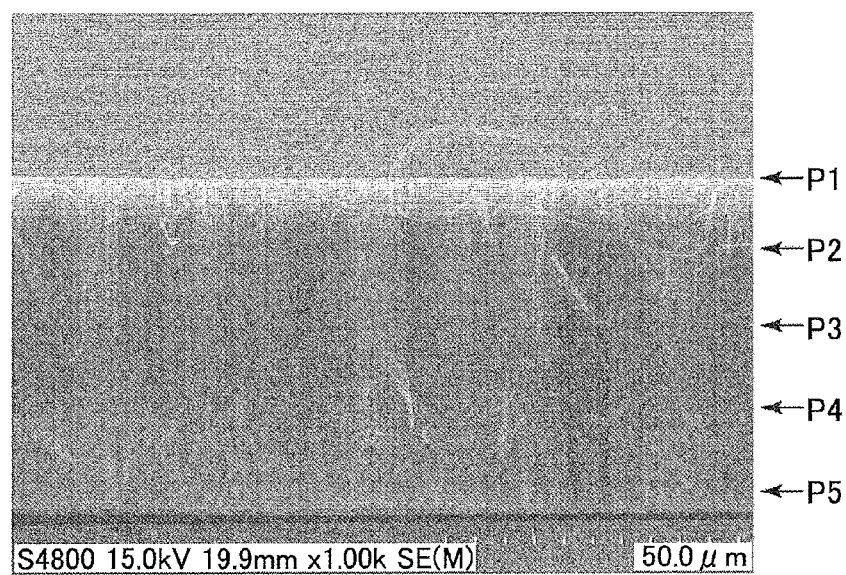
FIG. 11 is an SEM photographic image depicting coating layers formed on surfaces of the CNTs.
Figure 12A:
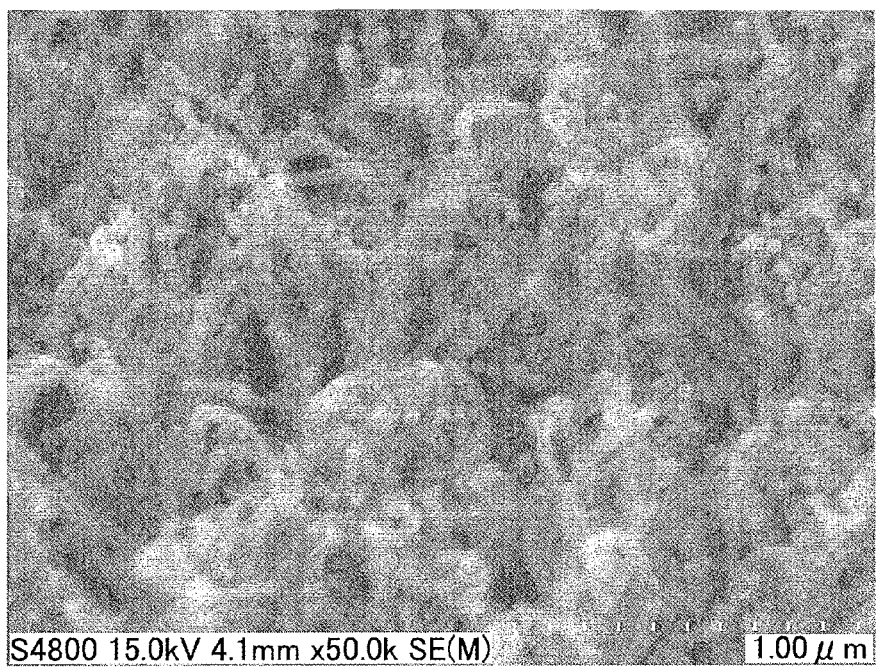
FIGS. 12A and 12B are enlarged SEM photographic images corresponding to measured parts P1 and P2 in FIG. 11.
Figure 12B:
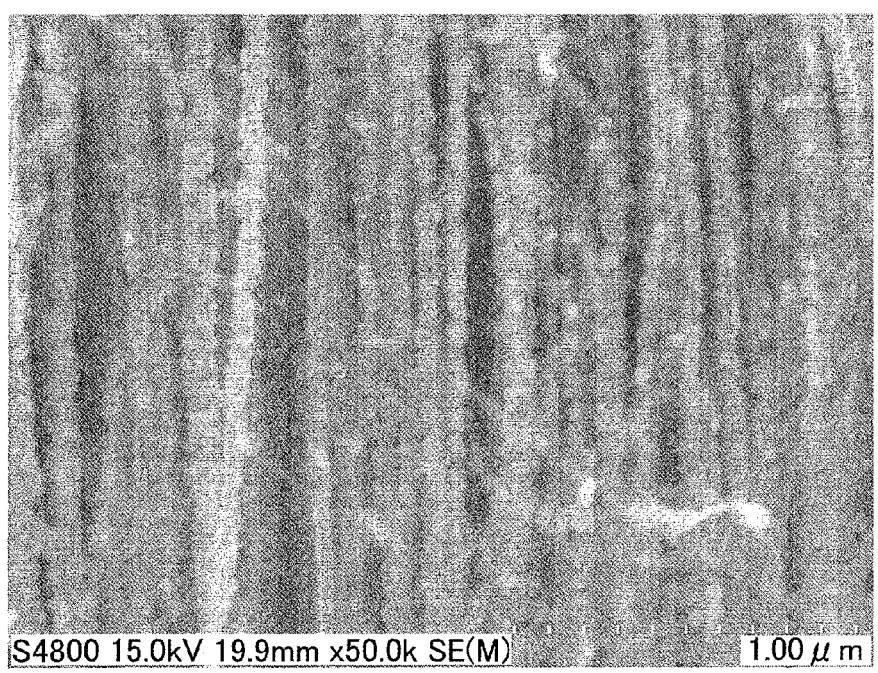
Figure 13A:
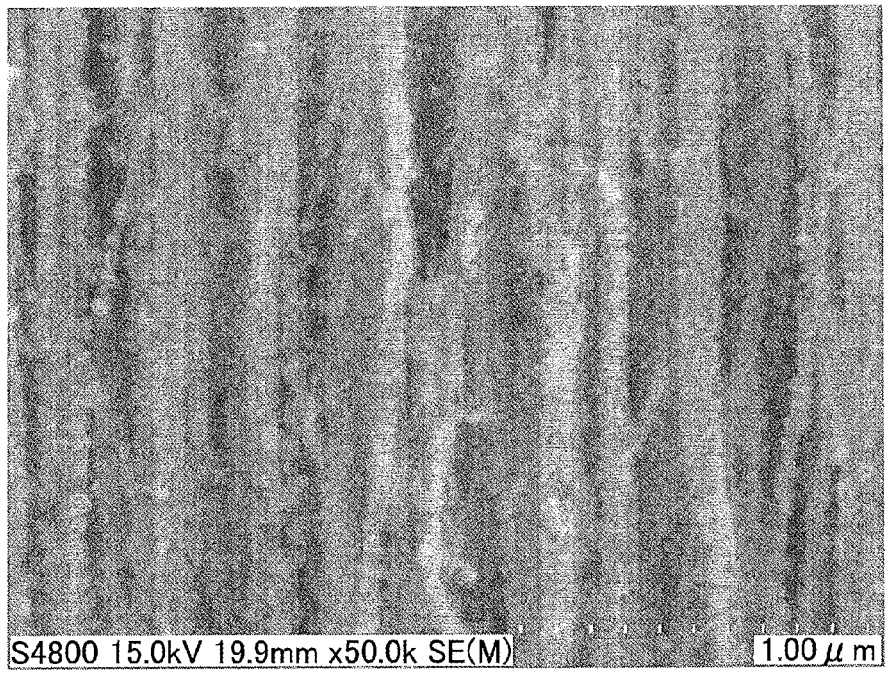
FIGS. 13A and 13B are enlarged SEM photographic images corresponding to measured parts P3 and P4 in FIG. 11.
Figure 13B:
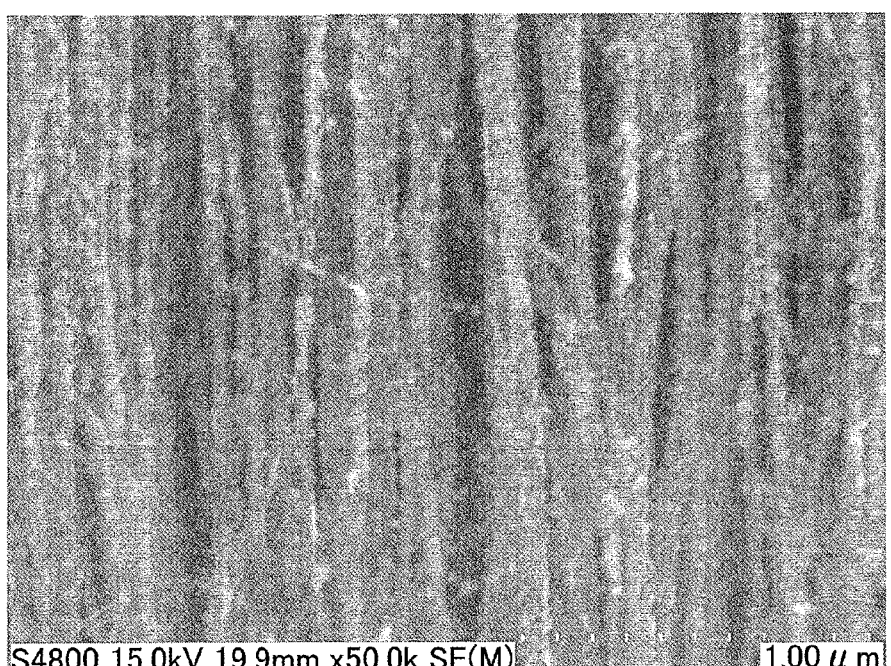
Figure 14:
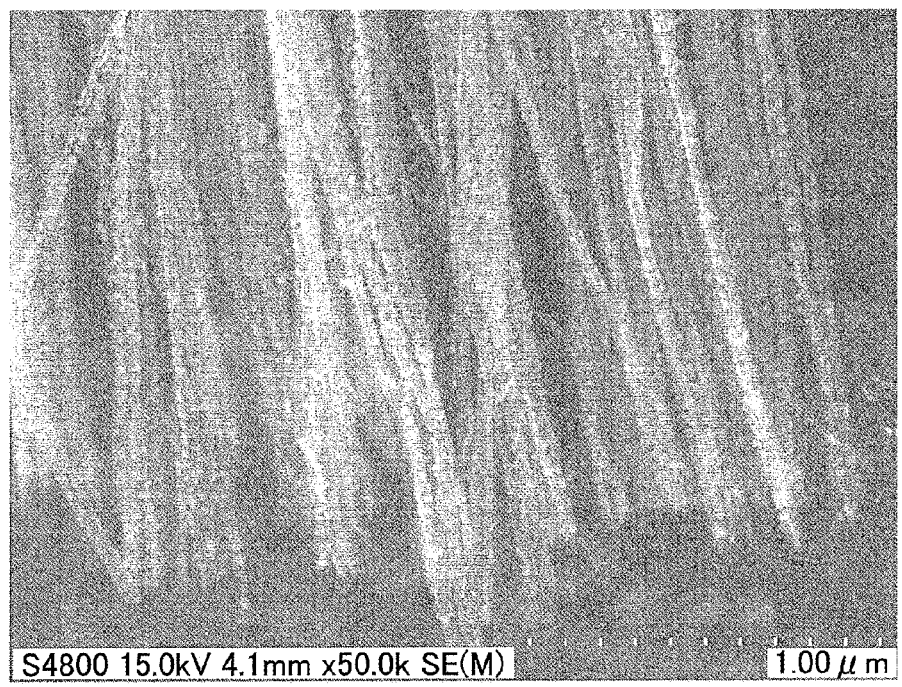
FIG. 14 is an enlarged SEM photographic image corresponding to a measured part P5 in FIG. 11.

FIG. 11 is an SEM photographic image depicting the coating layers 16 formed on the surfaces of the CNTs 12. FIG. 12A is an enlarged SEM photographic image corresponding to a measured part P1 in FIG. 11. FIG. 12B is an enlarged SEM photographic image corresponding to a measured part P2 in FIG. 11. FIG. 13A is an enlarged SEM photographic image corresponding to a measured part P3 in FIG. 11. FIG. 13B is an enlarged SEM photographic image corresponding to a measured part P4 in FIG. 11. FIG. 14 is an enlarged SEM photographic image corresponding to a measured part P5 in FIG. 11. Note that the tip parts 14 of the CNTs 12 are not bent when the CNTs 12 illustrated FIGS. 11 to 14 are imaged.

The particle size of the coating layers 16 at the measured part P1 was 36.6 nm (see FIG. 12A).

The particle size of the coating layers 16 at the measured part P2 was 37.0 nm (see FIG. 12B).

The particle size of the coating layers 16 at the measured part P3 was 32.6 nm (see FIG. 13A).

The particle size of the coating layers 16 at the measured part P4 was 27.6 nm (see FIG. 13B).

The particle size of the coating layers 16 at the measured part P5 was 19.6 nm (see FIG. 14).

Figure 15:
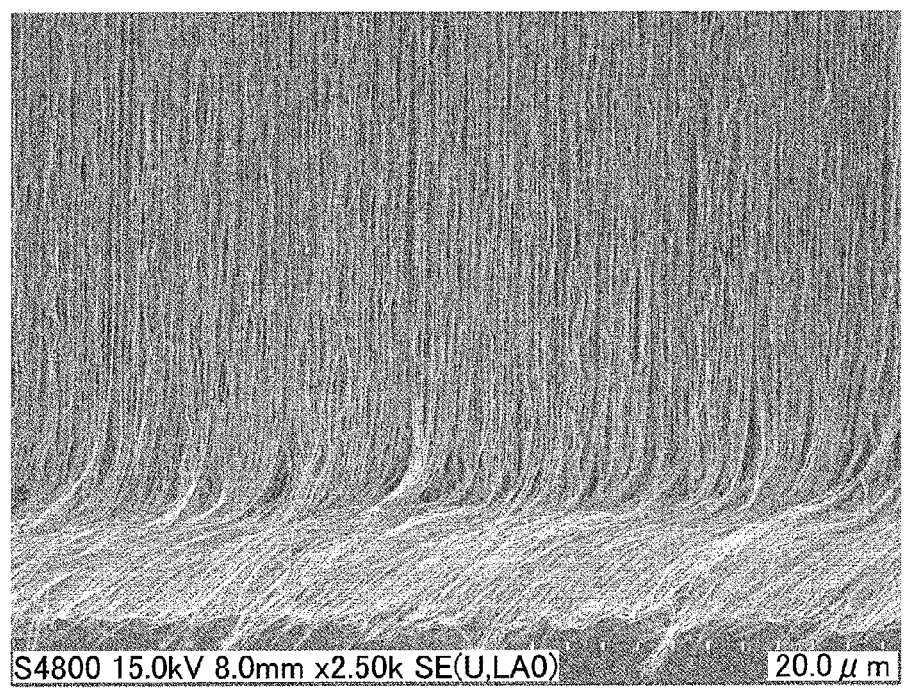
FIG. 15 is an SEM photographic image depicting bent base parts of the CNTs.

FIG. 15 is an SEM photographic image depicting the bent base parts 18 of the CNTs 12.

As is clear from FIG. 15, the base parts 18 of the CNTs 12 are bent.

Figure 16:
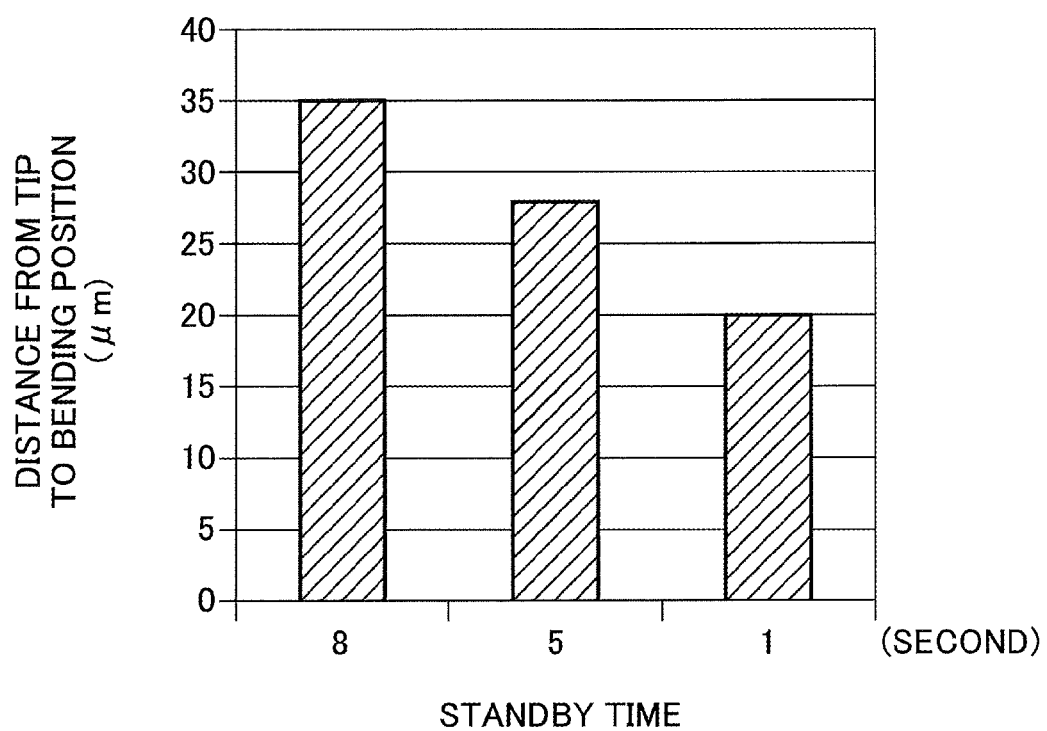
FIG. 16 is a graph illustrating a relationship between duration of standby time and a bending position.

FIG. 16 is a graph illustrating a relationship between duration of standby times t2 and t4 and positions at which the base parts 18 of the CNTs 12 are bent. The horizontal axis of FIG. 16 represents the standby times t2 and t4. The vertical axis of FIG. 16 represents a distance from the tip of the CNT 12 to a bending position (bent position) of the CNT 12. The length of the CNTs 12 employed in the evaluation was 83 μm.

As illustrated in FIG. 16, buckling (bending) of the CNTs 12 tends to occur near the tip parts 14 of the CNTs 12 as the standby times t2 and t4 decrease.

The bending positions of the CNT 12 may thus be controlled by appropriately adjusting the standby times t2 and t4.

Production Method of Electronic Apparatus

Next, a description is given of, with reference to FIGS. 17A to 18B, a method of producing an electronic apparatus according to an embodiment. FIGS. 17A to 18B are cross-sectional process views illustrating an example of a method of producing an electronic apparatus according to the embodiment.

Figure 17A:
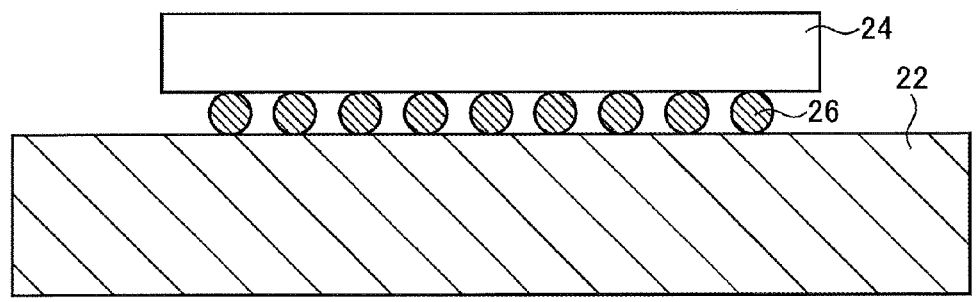
FIGS. 17A and 17B are cross-sectional process views (1) illustrating an example of a production method of an electronic apparatus according to an embodiment.

Initially, a semiconductor element 24 is mounted on a circuit board 22 as illustrated in FIG. 17A. The semiconductor element 24 may, for example, be connected to the circuit board 22 with solder bumps 26.

Figure 17B:
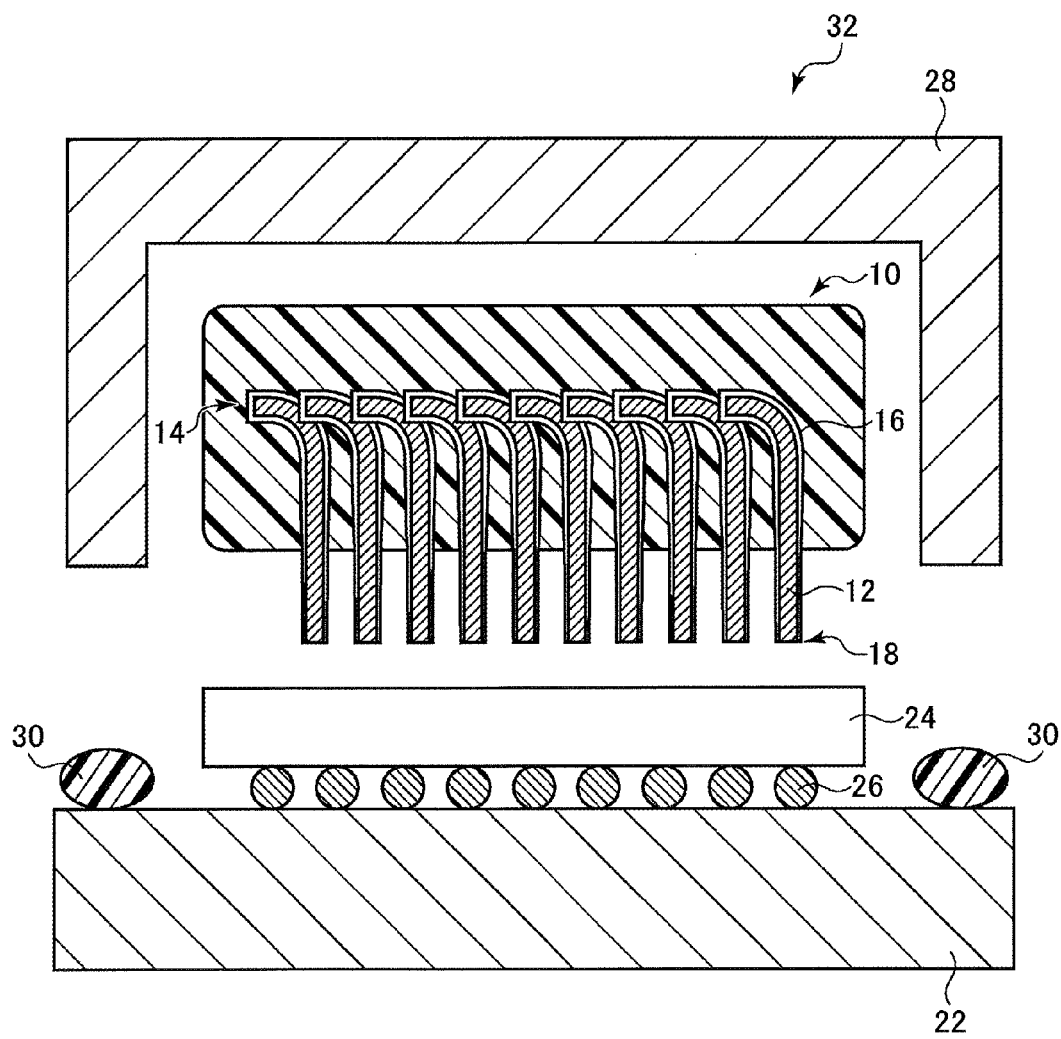

Subsequently, the heat dissipation structure 10 described above with reference to FIG. 1 is disposed on the semiconductor element 24 mounted on the circuit board 22, and the heat spreader 28 is further placed over the heat dissipation structure 10, as illustrated in FIG. 17B. In this step, the base parts 18 of the CNTs 12 are disposed near the semiconductor element 24, and the tip parts 14 of the CNTs 12 are disposed near the heat spreader 28. Organic sealant 30 or the like for securing the heat spreader 28 is applied in advance to the circuit board 22.

Figure 18A:
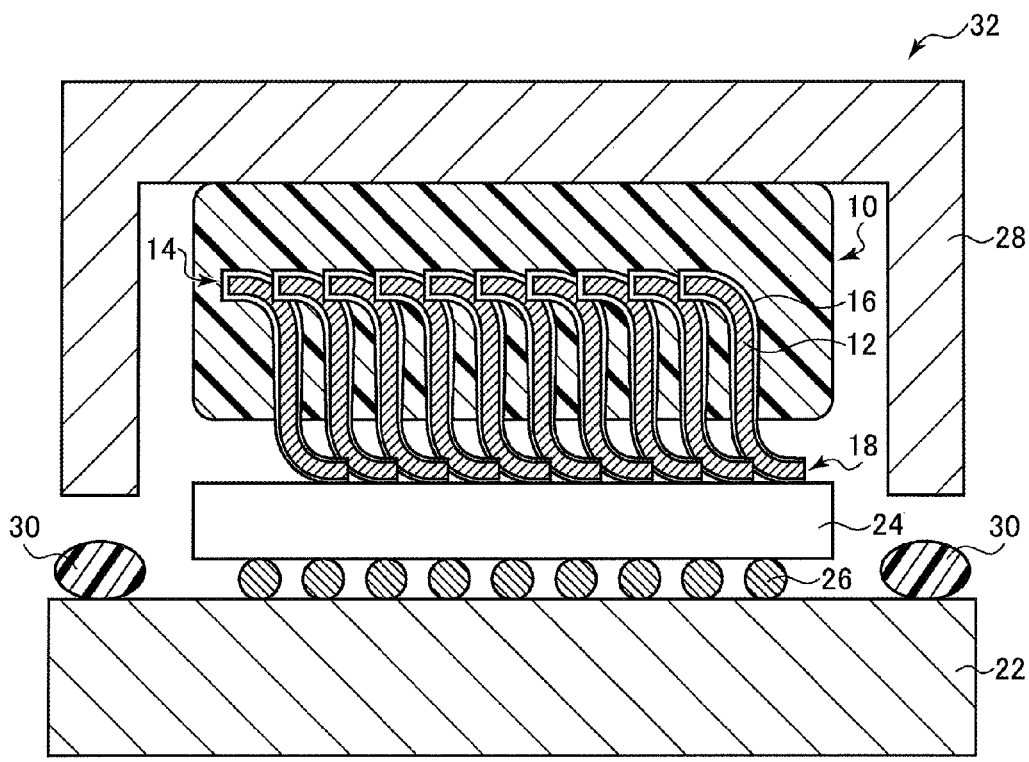
FIGS. 18A and 18B are cross-sectional process views (2) illustrating the example of the production method of the electronic apparatus according to the embodiment.
Figure 18B:
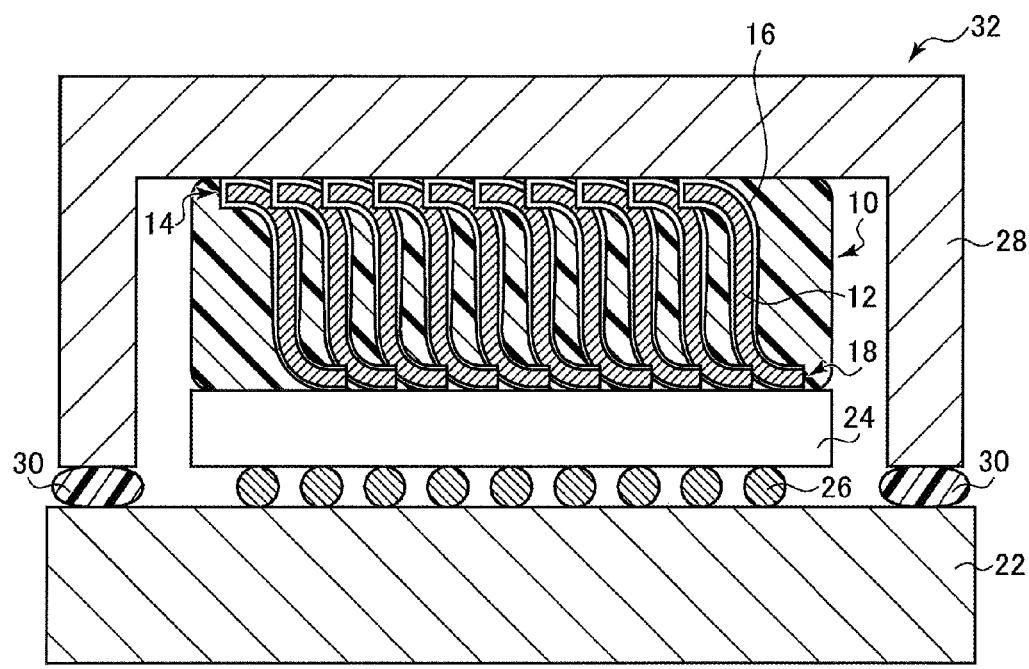

Subsequently, a load is applied to the heat spreader 28, as illustrated in FIG. 18A. The base parts 18 of the CNTs 12 to which the load is applied is applied deform plastically, thereby forming the bent base parts of the CNTs 12. The load applied may preferably be in a range of 0.5 to 1.5 MPa.

Subsequently, the resulting product 32 is heated at a temperature higher than the melting point temperature of the filler layer 20. The binding of the CNTs 12 with the filler layer 20 may be relaxed as the temperature rises, which allows parts of the lateral faces of the end parts 14 and 18 of the CNTs 12 within the heat dissipation structure 10 to be sufficiently and in linear contact with the semiconductor element 24 and the heat spreader 28 (see FIG. 18B). The heating temperature (i.e., the heat treatment temperature) may be approximately 225° C. The heating time (i.e., the heat treatment duration) may be approximately 30 min.

Subsequently, the filler layer 20 is solidified by cooling to room temperature, and the heat spreader 28 is secured on the circuit board 22 with the organic sealant 30. At this moment, the adhesiveness of the filler layer 20 develops, and the semiconductor element 24 and the heat spreader 28 are more firmly secured on the heat dissipation structure 10 with the adhesiveness of the filler layer 20. The resulting product 32 that has been cooled to room temperature may maintain low thermal resistance between the heat dissipation structure 10 and the semiconductor element 24 or the heat spreader 28.

The electronic apparatus 32 according to the embodiment is thus produced by the above-described method.

Note that the above-described example has illustrated an apparatus that employs the heat dissipation structure 10 including the CNTs 12 having the base parts 18 exposed from the filler layer 20; however, the apparatus is not limited to this example. The electronic apparatus may employ the heat dissipation structure 10 including the CNTs 12 having the both end parts 14 and 18 (i.e., the tip parts 14 and base parts 18) embedded in the filler layer 20 illustrated in FIG. 2.

Figure 19A:
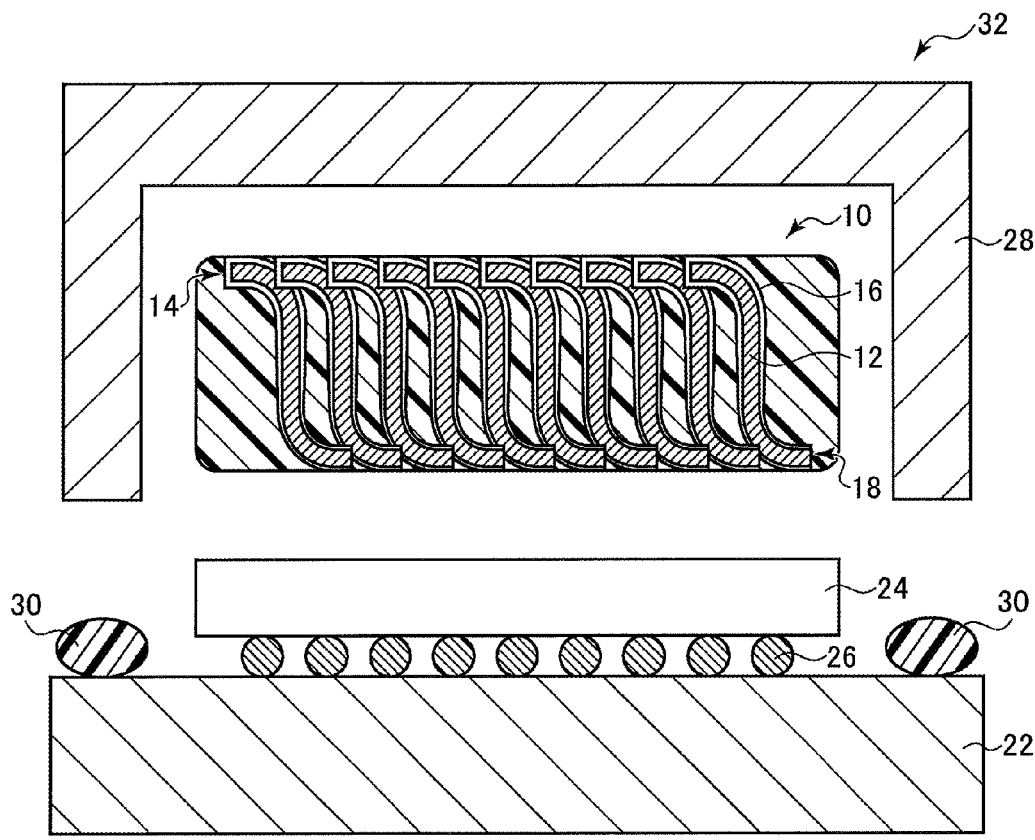
FIGS. 19A and 19B are cross-sectional process views illustrating another example of a production of an electronic apparatus according to an embodiment.
Figure 19B:
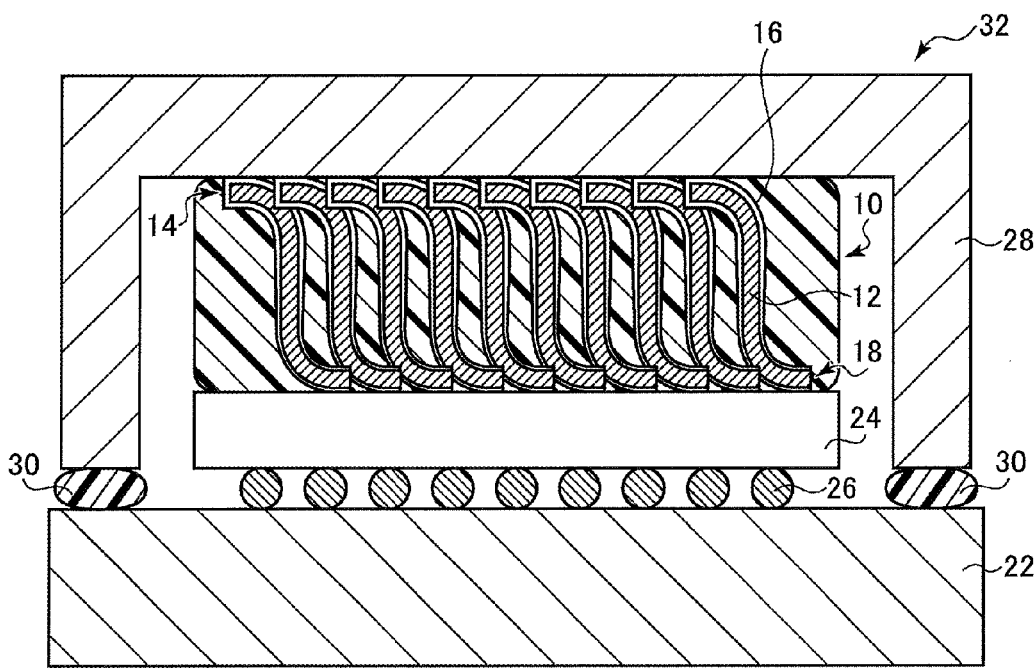

FIGS. 19A and 19B are cross-sectional process views illustrating another example of a method of producing the electronic apparatus according to the embodiment.

Initially, the heat dissipation structure 10 described above with reference to FIG. 2 is disposed on the semiconductor element 24 mounted on the circuit board 22, and the heat spreader 28 is further placed over the heat dissipation structure 10, as illustrated in FIG. 19A. In this step, the base parts 18 of the CNTs 12 are disposed near the semiconductor element 24, and the tip parts 14 of the CNTs 12 are disposed near the heat spreader 28. Organic sealant 30 or the like for securing the heat spreader 28 is applied in advance to the circuit board 22.

Subsequently, the resulting product 32 is heated at a temperature higher than the melting point temperature of the filler layer 20 while a load is applied to the heat spreader 28, as illustrated in FIG. 19B. The binding of the CNTs 12 with the filler layer 20 may be relaxed as the temperature rises, which allows parts of the lateral faces of the end parts 14 and 18 of the CNTs 12 within the heat dissipation structure 10 to be sufficiently and in linear contact with the semiconductor element 24 and the heat spreader 28. The heating temperature (i.e., the heat treatment temperature) may be approximately 225° C. The heating time (i.e., the heat treatment duration) may be approximately 30 min.

Subsequently, the filler layer 20 is solidified by cooling to room temperature, and the heat spreader 28 is secured on the circuit board 22 with the organic sealant 30. At this moment, the adhesiveness of the filler layer 20 develops, and the semiconductor element 24 and the heat spreader 28 are more firmly secured on the heat dissipation structure 10 with the adhesiveness of the filler layer 20. The resulting product 32 that has been cooled to room temperature may maintain low thermal resistance between the heat dissipation structure 10 and the semiconductor element 24 or the heat spreader 28.

The electronic apparatus may thus employ the heat dissipation structure 10 including the CNTs 12 having the end parts 14 and 18 (i.e., the tip parts 14 and base parts 18) embedded in the filler layer 20 illustrated in FIG. 2.

As described above, the method of producing the electronic apparatus according to the embodiment may enable the bent tip parts 14 and the bent base parts 18 of the CNTs 12 to be in contact with the heat generator 24 or the heat dissipater 28. This method enables the production of the electronic apparatus having good thermal conductivity.

Modification

The invention is not limited to the above-described embodiments, and various modification may be made.

For example, the method of producing the electronic apparatus according to the embodiment has described an example that may allow the base parts 18 of the CNTs 12 to be in contact with the semiconductor element 24, and allow the tip parts 14 of the CNTs 12 to be in contact with the heat spreader 28; however, the method is not limited to this example. The method may allow the tip parts 14 of the CNTs 12 to be in contact with the semiconductor element 24, and allow the base parts 18 of the CNTs 12 to be in contact with the heat spreader 28.

According to an aspect of embodiments, there is provided a heat dissipation structure that includes a plurality of linear structures made of carbon, each of the linear structures having at least one of a first end and a second end being bent; and a coating layer formed on a surface of each of the linear structures, the coating layer having a part covering the other one of the first ends and the second ends of the linear structures, a thickness of the part allowing the corresponding linear structures to be plastically deformable.

According to another aspect of embodiments, there is provided a method of fabricating a heat dissipation structure. The method includes forming a plurality of linear structures made of carbon on a substrate, each of the linear structures having a first end and a second end; bending the first ends of the linear structures; and forming a coating layer on a surface of the linear structures by atomic layer deposition, the coating layer having a part covering the second ends of the linear structures, a thickness of the part allowing the corresponding linear structures to be plastically deformable.

According to still another aspect of embodiments, there is provided an electronic apparatus that includes a heat dissipation structure including a heat generator; a heat dissipater; a plurality of linear structures made of carbon, each of the linear structures having at least one of a first end and a second end being bent; and a coating layer formed on a surface of each of the linear structures, the coating layer having a part covering the other one of the first ends and the second ends of the linear structures, a thickness of the part allowing the corresponding linear structures to be plastically deformable. In this configuration, a lateral surface of the one of the first and the second bent ends of the linear structures is partially in contact with one of the heat generator and the heat dissipater, and a lateral surface of the other one of the first and the second bent ends of the linear structures is partially in contact with the other one of the heat generator and the heat dissipater.

Disclosed embodiments suggest a heat dissipation structure that includes a plurality of linear structures made of carbon, each of the linear structures having at least one of a first end and a second end being bent; and a coating layer formed on a surface of each of the linear structures, the coating layer having a part covering the other one of the first ends and the second ends of the linear structures, a thickness of the part allowing the corresponding linear structures to be plastically deformable. Accordingly, the other one of the first ends and the second ends of the linear structures may be bent. This may allow a lateral surface of the first end or the other one of the first ends and the second ends of the linear structures to be in linear contact with the heat generator or the heat dissipater. Further, the first or the second bent end of the linear structure may be subjected to following deformation. This may control generation of the linear structures that are not in contact with the heat generator or the heat dissipater. The embodiments may thus provide a heat dissipation structure implementing good thermal conductivity.

What is claimed is:
1. A heat dissipation structure comprising:
  a plurality of linear structures made of carbon, each of the linear structures having at least one of a first end and a second end being bent; and a coating layer formed on a surface of each of the linear structures forming a plurality of coated linear structures, the coating layer having a first part covering the at least one of the first end and the second end, a thickness of the first part allowing the at least one of the first end and the second end of each of the coated linear structures to be elastically deformable, and a second part covering another one of the first end and the second end of each of the linear structures, a thickness of the second part allowing the another one of the first end and the second end of the coated linear structures to be plastically deformable.

2. The heat dissipation structure as claimed in claim 1, wherein the another one of the first end and the second end of each of the linear structures is bent.

3. The heat dissipation structure as claimed in claim 1, wherein the thickness of the part of the coating layer covering the another one of the first end and the second end of each of the linear structures is 20 nm or less.

4. The heat dissipation structure as claimed in claim 1, wherein
the coating layer includes aluminum oxides, titanium oxides, hafnium oxides, iron oxides, indium oxides, lanthanum oxides, molybdenum oxides, niobium oxides, nickel oxides, ruthenium oxides, silicon oxides, vanadium oxides, tungsten oxides, yttrium oxides, or zirconium oxides.

5. The heat dissipation structure as claimed in claim 1, further comprising a resin layer filling in between the coated linear structures.

6. A method of fabricating a heat dissipation structure, the method comprising:
forming a plurality of linear structures made of carbon on a substrate, each of the linear structures having a first end and a second end;
bending the first end of each of the linear structures; and
forming a coating layer on a surface of each of the linear structures by atomic layer deposition forming a plurality of coated linear structures, the coating layer having a first part covering the first bent end, a thickness of the first part allowing the first end of each of the coated linear structures to be elastically deformable, and a second part covering the second end of each of the linear structures, a thickness of the second part allowing the second end of the coated linear structures to be plastically deformable.

7. The method as claimed in claim 6, wherein the forming the coating layer includes controlling thickness distribution of the coating layer by controlling a time period from supplying a first raw material gas to supplying a second raw material gas.

8. The method as claimed in claim 6, further comprising: bending, after the forming the coating layer, the second end of the each of the coated linear structures by applying a load.

9. The method as claimed in claim 6, wherein the thickness of the second part of the coating layer covering the second end of each of the linear structures is 20 nm or less.

10. The method as claimed in claim 6, wherein
the coating layer includes aluminum oxides, titanium oxides, hafnium oxides, iron oxides, indium oxides, lanthanum oxides, molybdenum oxides, niobium oxides, nickel oxides, ruthenium oxides, silicon oxides, vanadium oxides, tungsten oxides, yttrium oxides, or zirconium oxides.

11. The method as claimed in claim 6, further comprising: filling in, after the forming the coating layer, resin between the coated linear structures.

12. An electronic apparatus comprising:
a heat dissipation structure including:
a heat generator;
a heat dissipater;
a plurality of linear structures made of carbon, each of the linear structures having a first end and a second end each being bent; and
a coating layer formed on a surface of each of the linear structures forming a plurality of coated linear structures, the coating layer having a first part covering the at least one of the first end and the second end, a thickness of the first part allowing the at least one of the first end and the second end of each of the coated linear structures to be elastically deformable, and a second part covering another one of the first end and the second end of each of the linear structures, a thickness of the second part allowing the another one of the first end and the second end of the coated linear structures to be plastically deformable, wherein
a lateral surface of the one of the first and the second bent end of each of the coated linear structures is partially in contact with one of the heat generator and the heat dissipater, and
a lateral surface of the another one of the first and the second bent end of the coated linear structures is partially in contact with another one of the heat generator and the heat dissipater.

* * * * *